US012772903B2

(12) United States Patent
Essig et al.

(10) Patent No.: US 12,772,903 B2
(45) Date of Patent: Oct. 20, 2026

(54) ELECTRONIC DEVICE

(71) Applicant: Advanced Semiconductor Engineering, Inc., Kaohsiung (TW)

(72) Inventors: Kay Stefan Essig, Radebeul (DE); You-Lung Yen, Taoyuan City (TW); Bernd Karl Appelt, Holly Springs, NC (US)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 592 days.

(21) Appl. No.: 18/223,528

(22) Filed: Jul. 18, 2023

(65) Prior Publication Data

US 2025/0029951 A1 Jan. 23, 2025

(51) Int. Cl.

| | |
|---|---|
| ***H01L 25/065*** | (2023.01) |
| ***H01L 23/00*** | (2006.01) |
| ***H01L 23/31*** | (2006.01) |
| ***H01L 23/48*** | (2006.01) |
| ***H01L 23/552*** | (2006.01) |
| ***H01L 23/66*** | (2006.01) |
| ***H01L 25/16*** | (2023.01) |
| ***H10W 20/20*** | (2026.01) |
| ***H10W 42/20*** | (2026.01) |
| ***H10W 44/20*** | (2026.01) |
| ***H10W 74/10*** | (2026.01) |
| ***H10W 90/00*** | (2026.01) |
| *H10W 72/00* | (2026.01) |

(Continued)

(52) U.S. Cl.

CPC ........... *H10W 90/00* (2026.01); *H10W 20/20* (2026.01); *H10W 42/20* (2026.01); *H10W 44/20* (2026.01); *H10W 72/877* (2026.01); *H10W 74/111* (2026.01); *H10W 44/248* (2026.01); *H10W 72/0198* (2026.01); *H10W 72/07253* (2026.01); *H10W 72/237* (2026.01); *H10W 72/884* (2026.01); *H10W 74/15* (2026.01); *H10W 90/724* (2026.01); *H10W 90/728* (2026.01); *H10W 90/734* (2026.01); *H10W 90/754* (2026.01)

(58) Field of Classification Search

CPC . H10W 90/00; H10W 90/728; H10W 90/724; H10W 90/754; H10W 90/734; H10W 44/20; H10W 44/248; H10W 74/111; H10W 74/15; H10W 42/20; H10W 72/877; H10W 72/07253; H10W 72/884; H10W 72/237; H10W 72/0198

See application file for complete search history.

(56) References Cited

U.S. PATENT DOCUMENTS 8,273,604 B2 * 9/2012 Kim .................... H10W 74/014
438/460
9,613,942 B2 * 4/2017 Lee .................... H01L 25/0652

(Continued)

*Primary Examiner* — Peniel M Gumedzoe
(74) *Attorney, Agent, or Firm* — Foley & Lardner LLP

(57) ABSTRACT

An electronic device is provided. The electronic device includes a first electronic component, a plurality of second electronic components, and a plurality of conductive elements. The plurality of second electronic components are disposed under the first electronic component. The plurality of conductive elements electrically connect the first electronic component to the plurality of second electronic components. The plurality of conductive elements are free from vertically overlapping the plurality of second electronic components.

15 Claims, 53 Drawing Sheets

(51) Int. Cl.
*H10W 72/20* (2026.01)
*H10W 74/15* (2026.01)

(56) References Cited

U.S. PATENT DOCUMENTS

| | | | | |
|---|---|---|---|---|
| 9,773,757 | B2 | 9/2017 | Yu et al. | |
| 10,381,326 | B2 | 8/2019 | Woychik et al. | |
| 2011/0316117 | A1 | 12/2011 | Kripesh et al. | |
| 2014/0185264 | A1* | 7/2014 | Chen | H01L 23/3128 361/814 |
| 2016/0071826 | A1 | 3/2016 | Kelkar et al. | |
| 2017/0062383 | A1* | 3/2017 | Yee | H01L 25/50 |
| 2019/0074261 | A1* | 3/2019 | Yu | H01L 25/0652 |
| 2023/0065615 | A1* | 3/2023 | Kung | H01L 25/0652 |

* cited by examiner

ELECTRONIC DEVICE

BACKGROUND

1. Field of the Disclosure

The present disclosure relates to an electronic device, in particular to an electronic device integrating multiple electronic components.

2. Description of Related Art

Recently, a three dimensional (3D) stacking technique and a 2.5D stacking technique are being developed to integrate electronic components with different functions. However, conventional 3D and 2.5D stacking techniques face multiple issues. For example, electronic components stacked by the 3D technique have a relatively large thickness; the 2.5D stacking technique has process challenges to overcome, such as alignment between the solder balls and the interposer, which are sensitive to warpage. Such alignment problems make it difficult to optimize the process conditions. In order to deal with the abovementioned problems, a new electronic device is required.

SUMMARY

According to some arrangements of the present disclosure, an electronic device includes a first electronic component, a plurality of second electronic components, and a plurality of conductive elements. The plurality of second electronic components are disposed under the first electronic component. The plurality of conductive elements electrically connect the first electronic component to the plurality of second electronic components. The plurality of conductive elements are free from vertically overlapping the plurality of second electronic components.

According to some arrangements of the present disclosure, an electronic device includes a first electronic component, a plurality of second electronic components, and a first circuit layer. The plurality of second electronic components are disposed under the first electronic component. The first circuit layer is disposed under the plurality of second electronic components. The first electronic component is electronically connected to the plurality of second electronic components by the first circuit layer.

According to some arrangements of the present disclosure, an electronic device includes a first electronic component and a second electronic component. The second electronic component is disposed under the first electronic component and spaced apart from the first electronic component by an adhesive layer. The electronic device provides an electrical path passing through the first electronic component and the second electronic component without passing through the adhesive layer.

BRIEF DESCRIPTION OF THE DRAWINGS

Aspects of the present disclosure are readily understood from the following detailed description when read with the accompanying figures. It should be noted that various features may not be drawn to scale for the sake of clarity.

Figure 1:
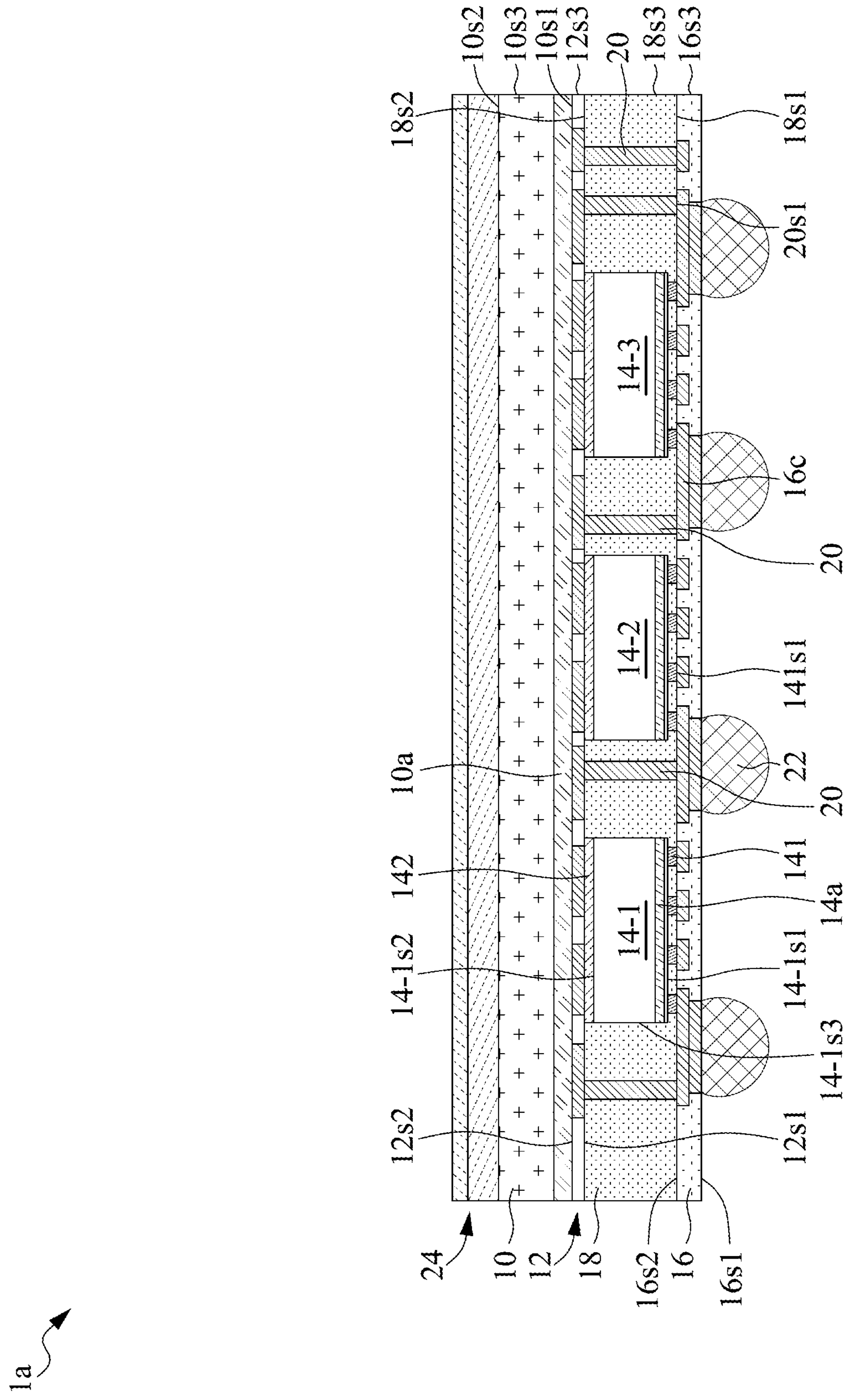
FIG. 1 is a cross-sectional view of an electronic device in accordance with some arrangements of the present disclosure.

Common reference numerals are used throughout the drawings and the detailed description to indicate the same or similar components. The present disclosure will be more apparent from the following detailed description taken in conjunction with the accompanying drawings.

DETAILED DESCRIPTION

The following disclosure provides many different arrangements, or examples, for implementing different features of the provided subject matter. Specific examples of components and arrangements are described as follows. These are, of course, merely examples and are not intended to be limiting. In the present disclosure, reference to the formation or disposal of a first feature over or on a second feature in the description that follows may include arrangements in which the first and second features are formed or disposed in direct contact, and may also include arrangements in which one or more additional features may be formed or disposed between the first and second features, such that the first and second features may not be in direct contact. In addition, the present disclosure may repeat reference numerals and/or letters in the various examples. The same reference numerals and/or letters refer to the same or similar parts. This repetition is for the purpose of simplicity and clarity and does not in itself dictate a relationship between the various arrangements and/or configurations.

Arrangements of the present disclosure are discussed in detail as follows. It should be appreciated, however, that the present disclosure provides many applicable concepts that can be embodied in a wide variety of specific contexts. The specific arrangements discussed are merely illustrative and do not limit the scope of the disclosure.

FIG. 1 is a cross-sectional view of an electronic device 1*a* in accordance with some arrangements of the present disclosure. In some arrangements, the electronic device 1*a* may include an electronic component 10, a redistribution structure 12, an electronic component 14-1, an electronic component 14-2, an electronic component 14-3, a circuit layer 16, an encapsulant 18, at least one conductive element 20, electrical connectors 22, and a heat dissipating element 24.

The electronic component 10 may include an active component. The active component may include a semiconductor die or a chip, such as a logic die (e.g., an application-specific IC (ASIC), application processor (AP), system-on-a-chip (SoC), central processing unit (CPU), graphics processing unit (GPU), microcontroller, etc.), a memory die (e.g., dynamic random access memory (DRAM) die, static random access memory (SRAM) die, etc.), a power management die (e.g., power management integrated circuit (PMIC) die), a radio frequency (RF) die, a sensor die, a micro-electro-mechanical-system (MEMS) die, a signal processing die (e.g., digital signal processing (DSP) die), a front-end die (e.g., analog front-end (AFE) dies) or other active components. The electronic component 10 may include a surface 10*s*1, a surface 10*s*2, and a surface 10*s*3. The surface 10*s*1 (or a lower surface) may function as an active surface, which a signal (e.g., data signal, power signal, and the like) passes through. The surface 10*s*2 (or an upper surface) may be opposite to the surface 10*s*1 and may function as a passive surface, which may also be referred to as a backside surface. The surface 10*s*3 (or a lateral surface) may extend between the surfaces 10*s*1 and 10*s*2. In some arrangements, the electronic component 10 may include a semiconductor substrate which may include silicon, germanium, or other suitable materials, such as, gallium arsenic, gallium phosphide, indium phosphide, indium arsenide, and/or indium antimonide. Said ICs may be formed within the semiconductor substrate of the electronic component 10. In some arrangements, said ICs may be formed adjacent to the surface 10*s*1 of the electronic component 10. Further, the electronic component 10 may include multiple terminals (not shown), such as conductive pads, on the surface 10*s*1 of the electronic component 10 for electrical connection. The electronic component 10 may include a circuit layer 10*a* within one or more ICs are disposed. In some arrangements, the circuit layer 10*a* may be disposed adjacent to the surface 10*s*1. In this condition, the surface 10*s*1 may be referred to as an active surface, and the surface 10*s*2 may be referred to as a passive surface. In other arrangements, the circuit layer 10*a* may be disposed adjacent to the surface 10*s*2. In this condition, the surface 10*s*2 may be referred to as an active surface, and the surface 10*s*1 may be referred to as a passive surface.

In some arrangements, the redistribution structure 12 may be disposed on or under the surface 10*s*1 of the electronic component 10. The redistribution structure 12 may include at least one conductive trace, and/or conductive via embedded within a dielectric layer(s). The redistribution structure 12 may include a fan-in structure. In some arrangements, the redistribution structure 12 may be electrically connected to the electronic component 10. The redistribution structure 12 may include a surface 12*s*1, a surface 12*s*2, and a surface 12*s*3. The surface 12*s*1 (or a lower surface) may be spaced apart from the electronic component 10. The surface 12*s*2 (or an upper surface) may be opposite to the surface 12*s*1. The surface 12*s*3 (or a lateral surface) may extend between the surfaces 12*s*1 and 12*s*2. Multiple terminals (not shown), such as conductive pads, may be disposed over the surface 12*s*2 and/or under surface 12*s*1. In some arrangements, the redistribution structure 12 may be regarded as a portion of the electronic component 10.

In some arrangements, the electronic components 14-1, 14-2, and 14-3 may be disposed on or under the surface 12*s*1 of the redistribution structure 12. The electronic components 14-1, 14-2, and 14-3 may include an active component, such as a memory die (e.g., DRAM die, SRAM die, etc.), a power management die (e.g., PMIC die), or other active components. Each of the electronic components 14-1, 14-2, and 14-3 may include an active surface, a passive surface, and a lateral surface. For example, the electronic component 14-1 may include a surface 14-1*s*1, a surface 14-1*s*2, and a surface 14-1*s*3. The surface 14-1*s*1 (or a lower surface) may function as an active surface, which a signal (e.g., data signal, power signal, and the like) passes through. In some embodiments, each of the electronic components 14-1, 14-2, and 14-3 may include an active circuit region 14*a*. The active circuit region 14*a* of the electronic component 14-1 may be disposed adjacent to the surface 14-1*s*1. The surface 14-1*s*2 (or an upper surface) may be opposite to the surface 14-1*s*1 and may function as a passive surface, which may also be referred to as a backside surface. The surface 14-1*s*3 (or a lateral surface) may extend between the surfaces 14-1*s*1 and 14-1*s*2. In some arrangements, each of the electronic components 14-1, 14-2, and 14-3 may include different functions. For example, each of the electronic components 14-1, 14-2, and 14-3 may include different ICs. In some arrangements, each of the electronic components 14-1, 14-2, and 14-3 may be electrically connected to or in communication with the electronic component 10. In some arrangements, the electronic component 10 may be a CPU, a SoC, or other IC that can control the electronic components 14-1, 14-2, and 14-3; the electronic components 14-1, 14-2, and 14-3 may include a memory die, a PMIC die, or other dies.

Each of the electronic components 14-1, 14-2, and 14-3 may include terminals 141 and an adhesive layer 142. The terminals 141 may be disposed on or under, for example, the surface 14-1*s*1 of the electronic component 14-1. Each of the terminals 141 may include, for example, a conductive pillar or other suitable elements. Each of the terminals 141 may include a conductive material(s), such as copper (Cu), aluminum (Al), tungsten (W), titanium (Ti), tantalum (Ta), or other applicable materials. The adhesive layer 142 may be disposed over, for example, the surface 14-1*s*2 of the electronic component 14-1. The adhesive layer 142 may be configured to attach the electronic components 14-1, 14-2, and 14-3 to the redistribution structure 12.

In some arrangements, the circuit layer 16 may be disposed on or under the electronic components 14-1, 14-2, and 14-3. In some arrangements, the surface 14-1*s*1 of the electronic component 14-1 may face the circuit layer 16. In some arrangements, the circuit layer 16 may include a fan-out structure. In some arrangements, the circuit layer 16 may include a redistribution structure. The circuit layer 16 may include at least one conductive trace, and/or conductive via embedded within a dielectric layer(s). In some arrangements, the circuit layer 16 may be electrically connected to the redistribution structure 12. In some arrangements, the circuit layer 16 may be electrically connected to the electronic components 14-1, 14-2, and 14-3. In some arrangements, the electronic components 14-1, 14-2, and 14-3 may be electrically connected to the circuit layer 16 by a non-solder joint. For example, no solder materials, such as tin or its derivatives, are formed or disposed between the electronic component 14-1 and the circuit layer 16. The circuit layer 16 may include a surface 16*s*1, a surface 16*s*2, and a surface 16*s*3. The surface 16*s*2 (or an upper surface) may be opposite to the surface 16*s*1 (or a lower surface). The surface 16*s*3 (or a lateral surface) may extend between the surfaces 16*s*1 and 16*s*2. Multiple terminals (not shown), such as conductive pads, may be disposed over the surface 16*s*2 and/or under surface 16*s*1.

In some arrangements, the encapsulant 18 may be disposed between the redistribution structure 12 and the circuit layer 16. In some arrangements, the encapsulant 18 may encapsulate the electronic components 14-1, 14-2, and 14-3.

In some arrangements, the encapsulant 18 may encapsulate the terminals 141. The encapsulant 18 may cover the surface 14-1*s*1 of the electronic component 14-1. The encapsulant 18 may cover the surface 14-1*s*3 of the electronic component 14-1. The encapsulant 18 may be disposed between a conductive layer 16*c* within the circuit layer 16 and the electronic component 14-1 (or 14-2 or 14-3). The encapsulant 18 may contacts the adhesive layer 142. The encapsulant 18 may include insulation or dielectric material. For example, the encapsulant 18 may include a molding compound. In some arrangements, the encapsulant 18 may be made of a molding material that may include, for example, a Novolac-based resin, an epoxy-based resin, a silicone-based resin, or another suitable encapsulant. Suitable fillers may also be included, such as powdered $SiO_2$. The encapsulant 18 may include a surface 18*s*1, a surface 18*s*2, and a surface 18*s*3. The surface 18*s*1 (or a lower surface) may face or be in contact with the circuit layer 16. The surface 18*s*2 (or an upper surface) may face or be in contact with the redistribution structure 12. The surface 18*s*3 may extend between the surfaces 18*s*1 and 18*s*2. In some arrangements, the surface 18*s*3 of the encapsulant 18 may be substantially aligned with the surface 16*s*3 of the circuit layer 16. In some arrangements, the surface 18*s*3 of the encapsulant 18 may be substantially aligned with the surface 12*s*3 of the redistribution structure 12. In some arrangements, the surface 18*s*3 of the encapsulant 18 may be substantially aligned with the surface 10*s*3 of the electronic component 10.

In some arrangements, the conductive element 20 may be disposed on or over the circuit layer 16. In some arrangements, the conductive element 20 may penetrate the encapsulant 18. In some arrangements, some of the conductive elements 20 may be disposed between or among the electronic components 14-1, 14-2, and 14-3. In some arrangements, the conductive element 20 may be electrically connected to the electronic component 10 (or redistribution structure 12) by a non-solder joint. In some arrangements, the conductive element 20 may extend between the surfaces 18*s*1 and 18*s*2 of the encapsulant 18. In some arrangements, the conductive element 20 may extend across the surface 14-1*s*3 of the electronic component 14-1. In some arrangements, the conductive element 20 may be electrically connected to the redistribution structure 12. In some arrangements, the conductive element 20 may be electrically connected to the circuit layer 16. In some arrangements, the conductive element 20 may be electrically connected to the electronic component 14-1, 14-2, and/or 14-3 through the circuit layer 16. For example, a conductive layer 16*c* within the circuit layer 16 may extend from a lower surface of the electronic component 14-1 (or to a lower surface of the terminal of the electronic component 14-1) to a lower surface of one of the conductive elements 20 to electrically connect the electronic component 14-1 and the conductive element 20. The conductive element 20 may surround the electronic component 14-1, 14-2, and/or 14-3. In some arrangements, the conductive element 20 may be free from vertically overlapping the electronic component 14-1, 14-2, and/or 14-3. In some arrangements, each of the electronic components 14-1, 14-2, and 14-3 may be in communication with each other by the redistribution structure 12 and the circuit layer 16 and the conductive element 20. In some arrangements, a surface 20*s*1 (or a lower surface) of the conductive element 20 may be substantially aligned with a surface 141*s*1 (or a lower surface) of the terminal 141. The conductive element 20 may include, for example, a conductive pillar or other suitable elements. The conductive element 20 may include a conductive material(s), such as copper (Cu), aluminum (Al), tungsten (W), titanium (Ti), tantalum (Ta), or other applicable materials.

The electrical connectors 22 may be disposed on or under the surface 16*s*1 of the circuit layer 16. The electrical connectors 22 may be configured to electrically connect the electronic device 1*a* to other device(s) (not shown). In some arrangements, the electrical connectors 22 may include a solder ball, such as a controlled collapse chip connection (C4) bump, a ball grid array (BGA), a land grid array (LGA), or so on. In some arrangements, the electrical connectors 22 may include a solder material(s), which may include alloys of gold and tin solder or alloys of silver and tin solder, or other suitable materials.

In some arrangements, the heat dissipating element 24 may be disposed on or over the surface 10*s*2 of the electronic component 10. The heat dissipating element 24 may cover the electronic component 10. In some arrangements, the heat dissipating element 24 may be configured to dissipate heat from the electronic component 10. The heat dissipating element 24 may also include a thermal interface material(s). In some arrangements, the heat dissipating element 24 may be replaced by a heat sink, which includes multiple protrusions protruding from a base portion. In some arrangements, the heat dissipating element 24 may include, but is not limited to, a solid metal slug or an electrical insulator coated with metallic film. In some arrangements, the heat dissipating element 24 may have one or more conductive layers. For example, the heat dissipating element 24 may include copper (Cu), aluminum (Al), gold (Au), nickel (Ni) and/or other suitable layers. The heat dissipating element 24 may also include aluminum oxide ($Al_2O_3$), aluminum nitride (AlN), or silicon nitride (SiN) plate coated with copper. In some arrangements, the heat dissipating element 24 may include a lower layer which functions as a thermally conductive layer with a greater thickness and an upper layer which functions as a protective layer with a less thickness. In some arrangements, a dimension (e.g., width or surface area) of the heat dissipating element 24 may be equal to or greater than that of the electronic component 10. The material of the heat dissipating element 24 may be different from that of the electronic component 10.

In a comparative electronic device, a three dimensional stacking (3D stacking) technique is utilized to integrate electronic components with different functions. In a 3D stacking electronic device, electronic components are stacked with three or more levels, which increases the overall thickness of the electronic device. In another comparative electronic device, a 2.5D stacking technique utilizes an interposer (e.g., a silicon interposer), which includes multiple through silicon vias (TSVs), to integrate electronic components with different functions. In this condition, an electronic component is electrically connected to the interposer by solder balls. Such technique involves an accuracy between the alignment of the solder balls and the TSVs, which is sensitive to the warpage of the intermediate structure. In this arrangement, some circuits are integrated within the electronic component 10, which can be in communication with electronic components 14-1, 14-2, and 14-3 with different functions. The electronic component 10 may be electrically connected to the circuit layer 16 by a non-solder joint. Further, a signal path (or an electrical path) between the electronic component 10 and the electronic components 14-1, 14-2, and 14-3 is free of solder joints. For example, the signal path may pass through the surface 10*s*1 of the electronic component 10, the redistribution structure 12, the conductive element 20, the circuit layer 16, and the active surface (e.g., 14-1*s*1) of the electronic component 14-1 (or 14-2 or 14-3). The signal path does not pass through the adhesive layer 142. The alignment issue between the solder balls and the TSVs can be ignored during manufacturing of the electronic device 1*a*. Further, a silicon interposer can be omitted in this arrangement. Therefore, the thickness of the electronic device 1*a* can be reduced.

Figure 2:
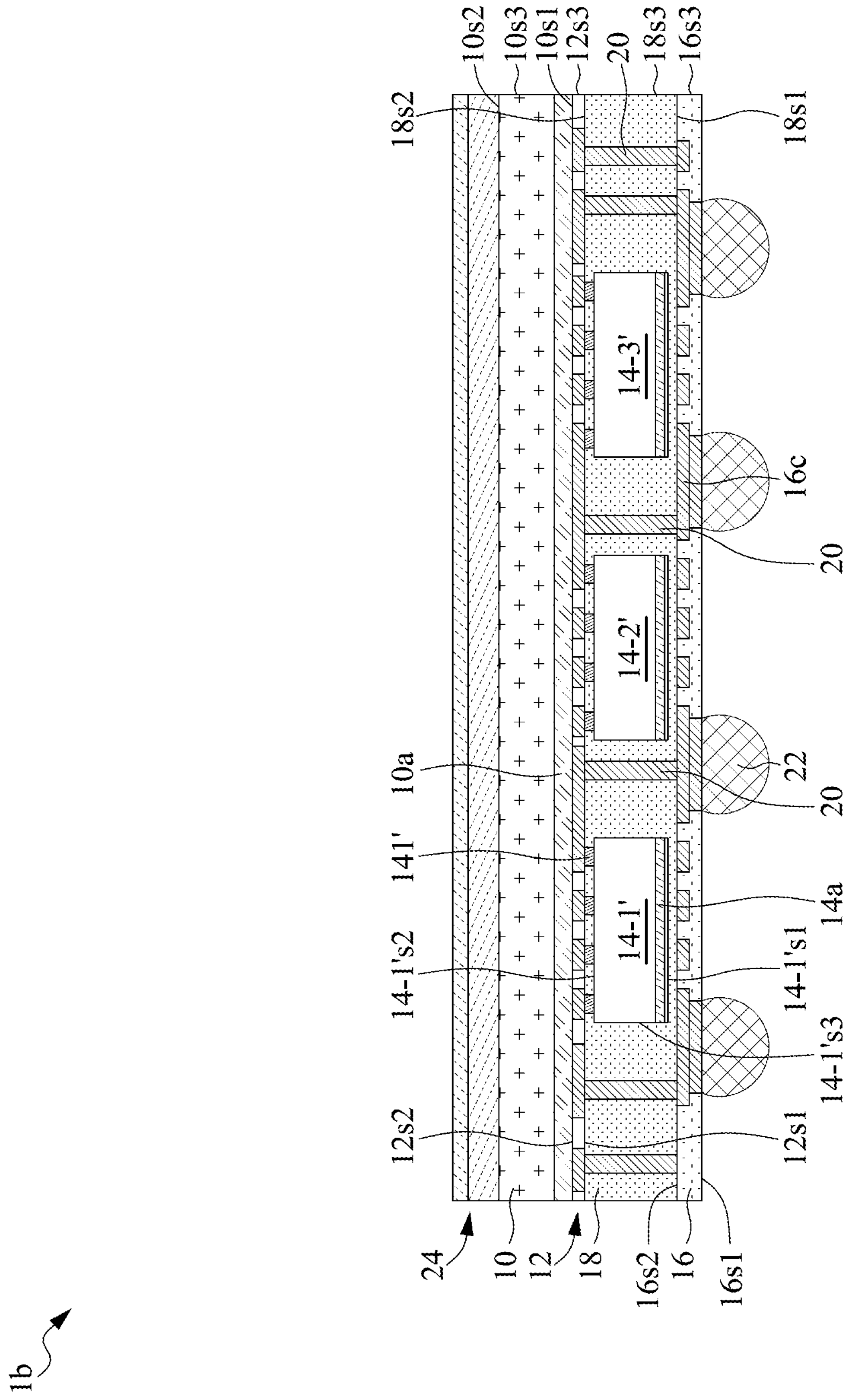
FIG. 2 is a cross-sectional view of an electronic device in accordance with some arrangements of the present disclosure.

FIG. 2 is a cross-sectional view of an electronic device 1*b* in accordance with some arrangements of the present disclosure. The electronic device 1*b* may be similar to the electronic device 1*a* as shown in FIG. 1, and the differences therebetween are described below.

The electronic device 1*b* may include electronic components 14-1', 14-2', and 14-3'. In some arrangements, the electronic components 14-1', 14-2', and 14-3' may be disposed on or under the surface 10*s*1 of the electronic component 10. In some arrangements, the electronic components 14-1', 14-2', and 14-3' may be disposed on or under the surface 12*s*1 of the redistribution structure 12. The electronic components 14-1', 14-2', and 14-3' may include an active component, such as a memory die (e.g., DRAM die, SRAM die, etc.), a power management die (e.g., PMIC die), an RF die, a sensor die, a MEMS die, a signal processing die (e.g., DSP die), a front-end die (e.g., AFE dies) or other active components. Each of the electronic components 14-1', 14-2', and 14-3' may include an active surface, a passive surface, and a lateral surface. For example, the electronic component 14-1' may include a surface 14-1'*s*1, a surface 14-1'*s*2, and a surface 14-1'*s*3. The surface 14-1'*s*1 (or a lower surface) may function as a passive surface, which may also be referred to as a backside surface. The surface 14-1'*s*2 (or an upper surface) may be opposite to the surface 14-1'*s*1 and function as an active surface, which a signal (e.g., data signal, power signal, and the like) passes through. The surface 14-1'*s*3 (or a lateral surface) may extend between the surfaces 14-1'*s*1 and 14-1'*s*2. In some arrangements, each of the electronic components 14-1', 14-2', and 14-3' may include different functions. For example, each of the electronic components 14-1', 14-2', and 14-3' may include different ICs. In some arrangements, each of the electronic components 14-1', 14-2', and 14-3' may be electrically connected to or in communication with the electronic component 10.

Each of the electronic components 14-1', 14-2', and 14-3' may include terminals 141'. In some arrangements, the terminals 141' may be disposed on or over, for example, the surface 14-1'*s*2 of the electronic component 14-1'. The terminals 141' may include a conductive material(s), such as copper (Cu), aluminum (Al), tungsten (W), titanium (Ti), tantalum (Ta), or other applicable materials. In this arrangement, the redistribution structure 12 may include a first circuit for electrically connecting the electronic components 14-1', 14-2', and/or 14-3' and a second circuit for electrically connecting the conductive element 20. In some arrangements, the first circuit and the second circuit may have different dimensions. In some arrangements, the line width/line space (L/S) of the first circuit may be different from that of the second circuit. In some arrangements, the first circuit and the second circuit may have different densities (e.g., the number of conductive elements per unit area). In some arrangements, the density of the second circuit may be greater than that of the first circuit. For example, the conductive layer(s), conductive trace(s), conductive pad(s), and/or conductive via(s) of the second circuit may have a density greater than that of the conductive layer(s), conductive trace(s), conductive pad(s), and/or conductive via(s) of the first circuit.

Figure 3:
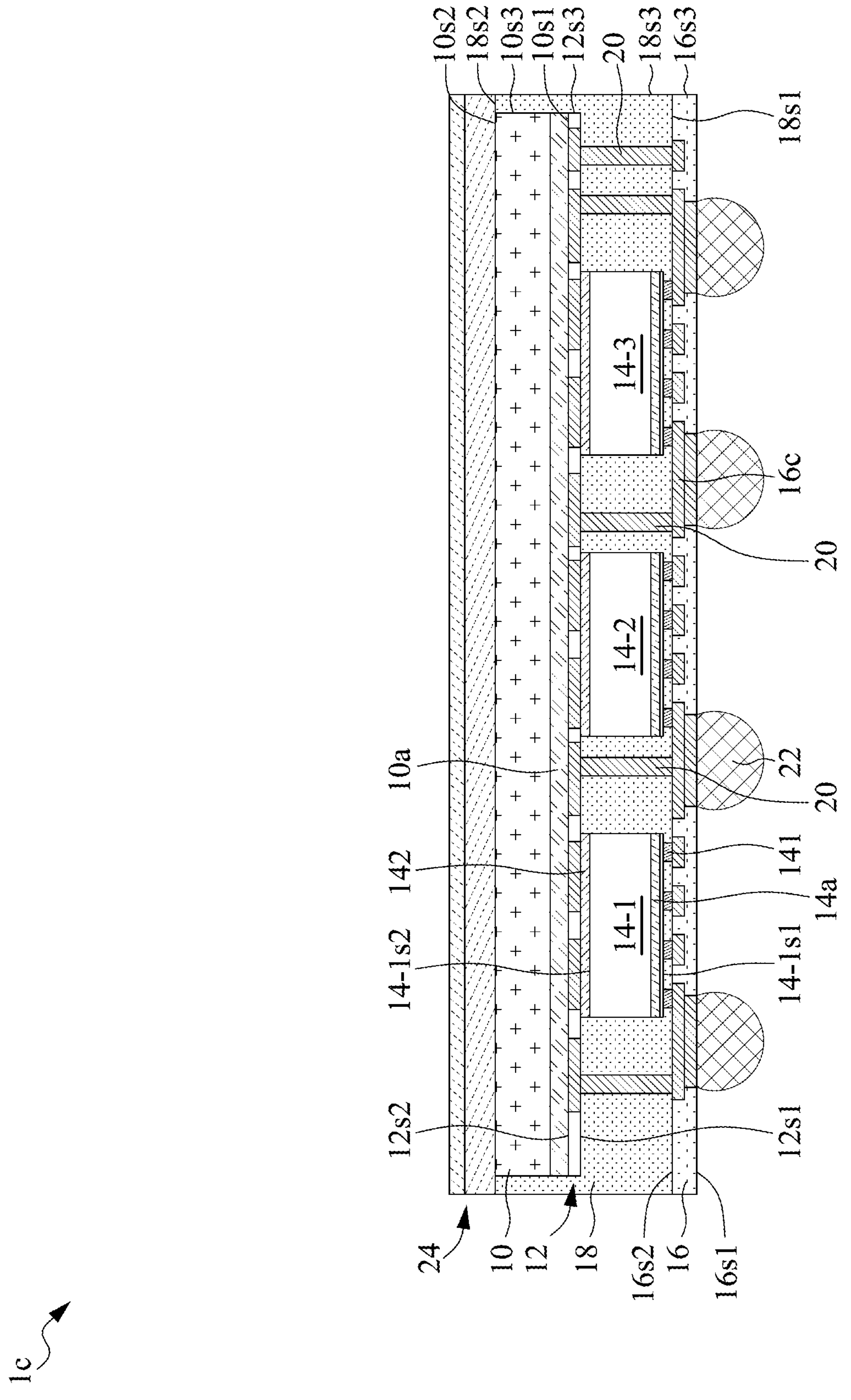
FIG. 3 is a cross-sectional view of an electronic device in accordance with some arrangements of the present disclosure.

FIG. 3 is a cross-sectional view of an electronic device 1*c* in accordance with some arrangements of the present disclosure. The electronic device 1*c* may be similar to the electronic device 1*a* as shown in FIG. 1, and the differences therebetween are described below.

In some arrangements, the surface 10*s*3 of the electronic component 10 may be covered by the encapsulant 18. In some arrangements, the width, along a direction substantially orthogonal to the normal direction of the surface 10*s*1, of the electronic component 10 may be different from that of the encapsulant 18. In some arrangements, the surface 10*s*3 of the electronic component 10 may have an offset to the surface 18*s*3 of the encapsulant 18. In some arrangements, the surface 10*s*3 of the electronic component 10 may have an offset to the surface 16*s*3 of the circuit layer 16. In some arrangements, the encapsulant 18 may be in contact with the heat dissipating element 24.

In some arrangements, the surface 12*s*3 of the redistribution structure 12 may be covered by the encapsulant 18. In some arrangements, the surface 12*s*3 of the redistribution structure 12 may have an offset to the surface 18*s*3 of the encapsulant 18. In some arrangements, the surface 12*s*3 of the redistribution structure 12 may have an offset to the surface 16*s*3 of the circuit layer 16. In some arrangements, the width of the redistribution structure 12 may be different from that of the circuit layer 16. The surface 10*s*3 of the electronic component 10 is encapsulated by the encapsulant 18, which thereby prevents the electronic component 10 from being damaged by the surrounding environment.

Figure 4:
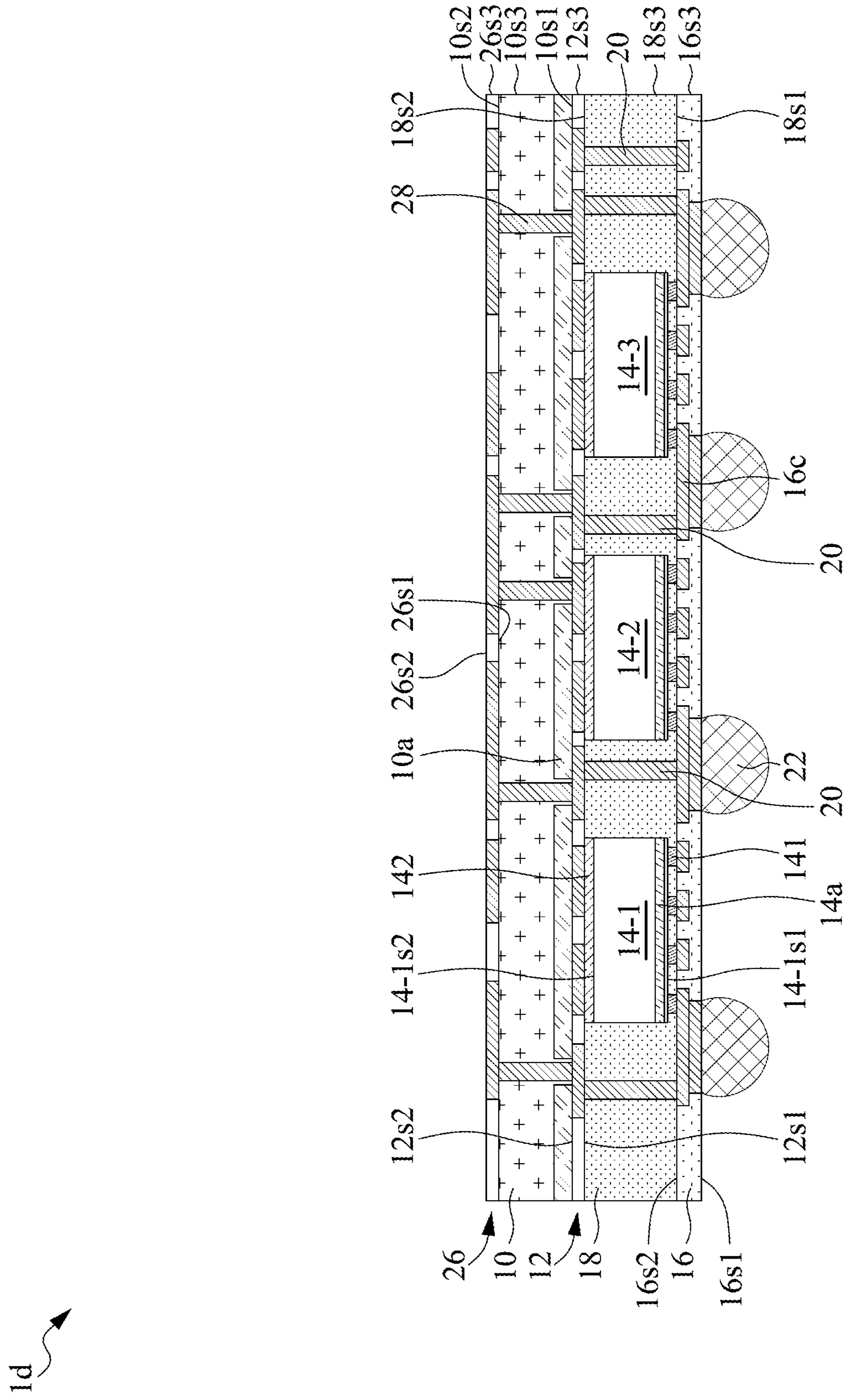
FIG. 4 is a cross-sectional view of an electronic device in accordance with some arrangements of the present disclosure.

FIG. 4 is a cross-sectional view of an electronic device 1*d* in accordance with some arrangements of the present disclosure. The electronic device 1*d* may be similar to the electronic device 1*a* as shown in FIG. 1, and the differences therebetween are described below.

In some arrangements, the electronic device 1*d* may include a circuit layer 26. In some arrangements, the circuit layer 26 may be disposed on or over the electronic component 10. In some arrangements, the circuit layer 26 may include a fan-out structure. In some arrangements, the circuit layer 26 may include a redistribution structure. The circuit layer 26 may include at least one conductive trace, and/or conductive via embedded within a dielectric layer(s). In some arrangements, the circuit layer 26 may be electrically connected to the electronic component 10. In some arrangements, the circuit layer 26 may be electrically connected to the electronic components 14-1, 14-2, and 14-3. The circuit layer 26 may be configured to electrically connect the electronic device 1*d* to an external device (not shown). The circuit layer 26 may include a surface 26*s*1, a surface 26*s*2, and a surface 26*s*3. The surface 26*s*1 (or a lower surface) may face or be in contact with the electronic component 10. The surface 26*s*2 (or an upper surface) may be opposite to the surface 26*s*1. The surface 26*s*3 (or a lateral surface) may extend between the surfaces 26*s*1 and 26*s*2. Multiple terminals (not shown), such as conductive pads, may be disposed on or over the surface 26*s*2 and/or under surface 26*s*1. In some arrangements, the surface 26*s*3 of the circuit layer 26 may be substantially aligned with the surface 10*s*3 of the electronic component 10. In some arrangements, the surface 26*s*3 of the circuit layer 26 may be substantially aligned with the surface 12*s*3 of the redistribution structure 12. In some arrangements, the surface 26*s*3 of the circuit layer 26 may be substantially aligned with the surface 16*s*3 of the circuit layer 16.

In some arrangements, the electronic component 10 may include one or more through vias 28. Each of the through vias 28 may extend between the surfaces 10*s*1 and 10*s*2. In some arrangements, the through via 28 may electrically connect the redistribution structure 12 and the circuit layer 26. The through via 28 may be configured to connect a component disposed over the electronic component 10. Said component may include, for example, a heat dissipating element, a package structure, and/or an integrated circuit. In some arrangements, the through via 28 may vertically overlap at least one of the electronic components 14-1 to 14-3. The through via 28 may include, for example, a through silicon via (TSV) or other suitable elements.

Figure 5:
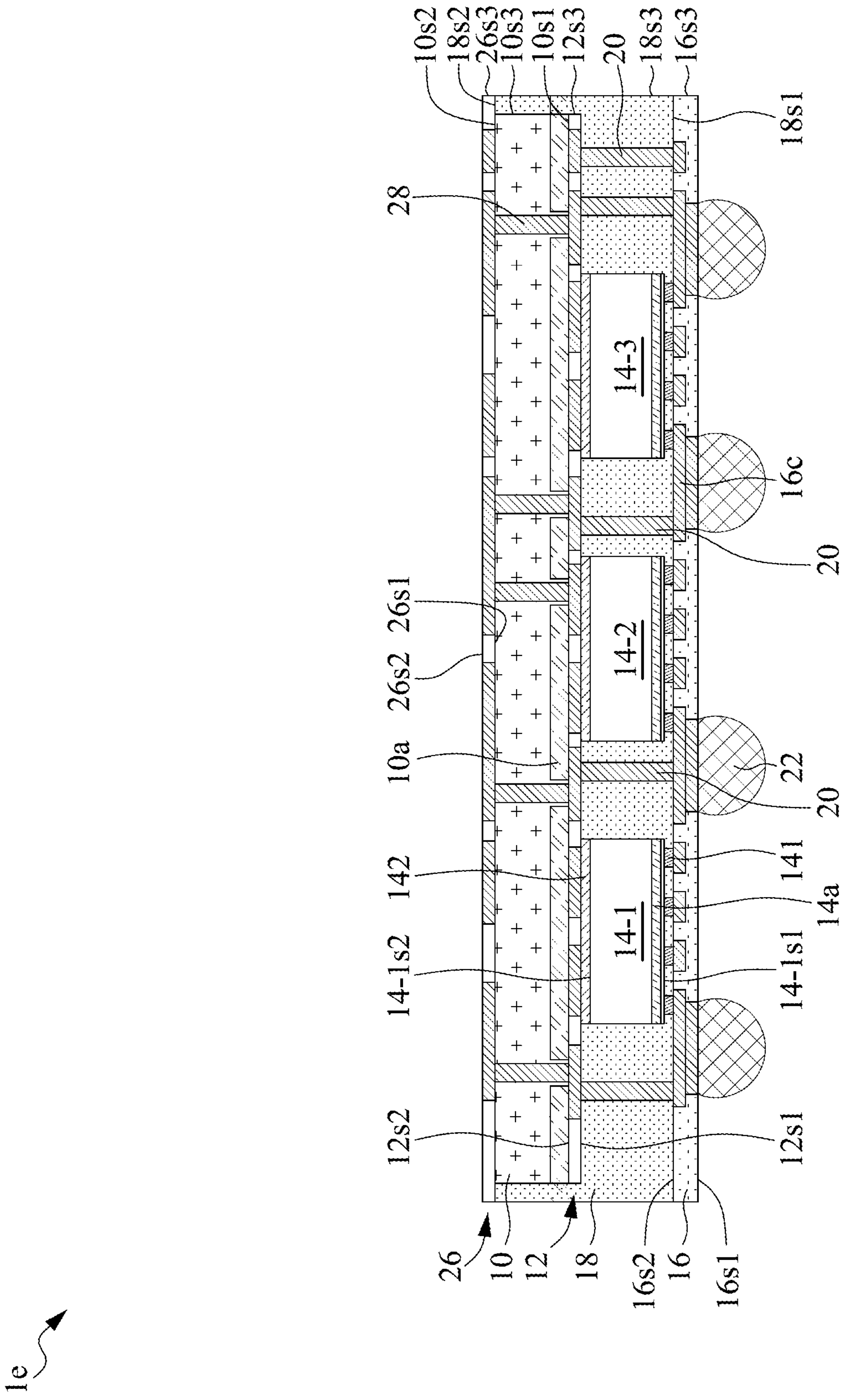
FIG. 5 is a cross-sectional view of an electronic device in accordance with some arrangements of the present disclosure.

FIG. 5 is a cross-sectional view of an electronic device 1*e* in accordance with some arrangements of the present disclosure. The electronic device 1*e* may be similar to the electronic device 1*d* as shown in FIG. 4, and the differences therebetween are described below.

In some arrangements, the surface 10*s*3 of the electronic component 10 may be covered by the encapsulant 18. In some arrangements, the width of the electronic component 10 may be different from that of the circuit layer 26. In some arrangements, the surface 10*s*3 of the electronic component 10 may have an offset to the surface 26*s*3 of the circuit layer 26. In some arrangements, the encapsulant 18 may be in contact with the surface 26*s*1 of the circuit layer 26. In some arrangements, the encapsulant 18 may be in contact with either the dielectric layer, the trace, or both of the circuit layer 26. As a result, a mold lock effect may be enhanced, which thereby enhances the reliability of the electronic device 1*e*. The surface 10*s*3 of the electronic component 10 is encapsulated by the encapsulant 18, which thereby prevents the electronic component 10 from being damaged by the surrounding environment. The encapsulant 18 may be in contact with the surface 12*s*3 of the redistribution structure 12. For example, the encapsulant 18 may be in contact with the lateral surface of the dielectric material of the redistribution structure 12.

Figure 6:
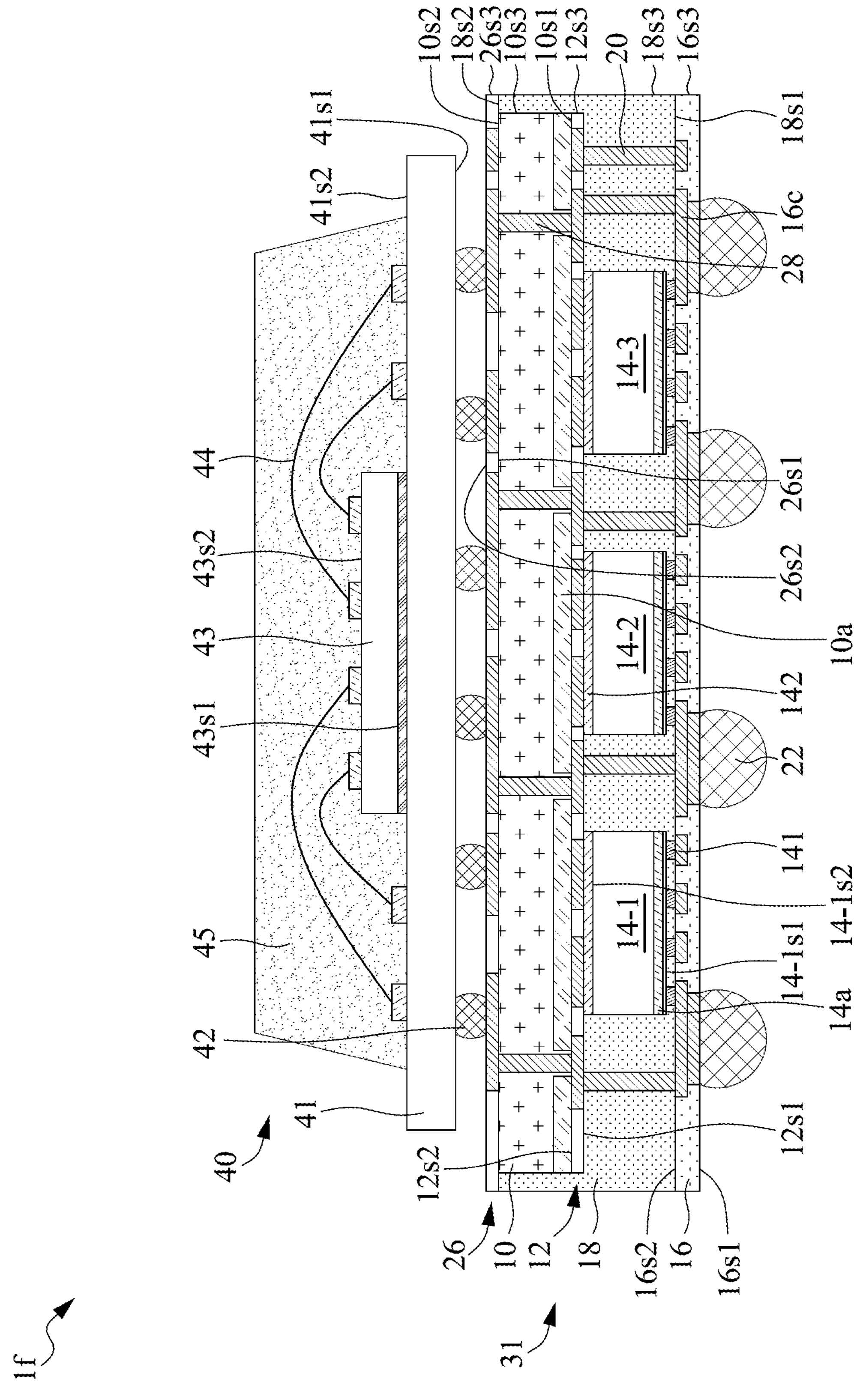
FIG. 6 is a cross-sectional view of an electronic device in accordance with some arrangements of the present disclosure.

FIG. 6 is a cross-sectional view of an electronic device if in accordance with some arrangements of the present disclosure.

In some arrangements, the electronic device if may include a device 31 and a package structure 40. In some arrangements, the structure of the device 31 may be the same as or similar to that of the electronic device 1*e* as shown in FIG. 5.

In some arrangements, the package structure 40 may be disposed on or over the surface 26*s*2 of the circuit layer 26. In some arrangements, the package structure 40 may include a carrier 41, electrical connectors 42, an electronic component 43, conductive wires 44, and an encapsulant 45.

The carrier 41 may be disposed over the circuit layer 26. The carrier 41 may be formed as a printed circuit board (PCB), including multiple metal layers separated from one another by layers of dielectric material and interconnected by electrically conductive vias. In some arrangements, the carrier 41 may be formed of an epoxy resin, a fiberglass-reinforced epoxy resin, an epoxy resin with inorganic fillers, a ceramic material, or a polymer material such as polyimide. In some arrangements, the carrier 41 may have a surface 41*s*1 and a surface 41*s*2. The surface 41*s*1 (or a lower surface) may face the device 31. The surface 41*s*2 (or an upper surface) may be opposite to the surface 41*s*1. The carrier 41 may include one or more conductive pads (not shown) in proximity to, adjacent to, embedded in, and/or exposed by the surface 41*s*1 and/or surface 41*s*2 of the carrier 41. The carrier 41 may include a solder resist (not shown) on the surface 41*s*1 and/or surface 41*s*2 of the carrier 41 to fully expose or to expose at least a portion of the conductive pads for electrical connections.

The electrical connectors 42 may be disposed on or under the surface 41*s*1 of the carrier 41. The electrical connectors 42 may be configured to electrically connect the device 31 and the carrier 41. In some arrangements, the electrical connectors 42 may include a solder ball, such as a controlled collapse chip connection (C4) bump, a ball grid array (BGA), a land grid array (LGA), or so on. In some arrangements, the electrical connectors 42 may include a solder material(s), which may include alloys of gold and tin solder or alloys of silver and tin solder, or other suitable materials.

The electronic component 43 may be disposed on or over the surface 41*s*2 of the carrier 41. The electronic component 43 may be electrically connected to the electronic component 10. The electronic component 43 may include an active component, such as a logic die (e.g., ASIC, AP, SoC, CPU, GPU, microcontroller, etc.), a memory die (e.g., DRAM die, SRAM die, etc.), a power management die (e.g., PMIC die), an RF die, a sensor die, a MEMS die, a signal processing die (e.g., DSP die), a front-end die (e.g., AFE dies) or other active components. The electronic component 43 may include a surface 43*s*1 and a surface 43*s*2. The surface 43*s*1 (or a lower surface) may function as a passive surface, which may also be referred to as a backside surface. The surface 43*s*2 (or an upper surface) may be opposite to the surface 43*s*1 and function as an active surface, which a signal (e.g., data signal, power signal, and the like) passes through. The electronic component 43 may be attached to the carrier 41 by an adhesive (not annotated). The electronic component 43 may include one or more conductive pads in proximity to, adjacent to, embedded in, and/or exposed by the surface 43*s*2.

The conductive wires 44 may be configured to electrically connect the carrier 41 and the electronic component 43. Each of the conductive wires 44 may have one end connected to the surface 41*s*2 of the carrier 41 and the other end connected to the surface 43*s*2 of the electronic component 43. Although FIG. 6 illustrates that the electronic component 43 is electrically connected to the carrier 41 by the conductive wires 44, the electronic component 43 may be electrically connected to the carrier 41 by other techniques, such as a flip-chip bonding technique.

The encapsulant 45 may be disposed on or over the surface 41*s*2 of the carrier 41. In some arrangements, the encapsulant 45 may encapsulate the electronic component 43. In some arrangements, the encapsulant 45 may encapsulate the conductive wires 44. In some arrangements, a portion of the surface 41*s*2 of the carrier 41 may be exposed by the encapsulant 45. The encapsulant 45 may include insulation or dielectric material. For example, the encapsulant 45 may include a molding compound. In some arrangements, the encapsulant 45 may be made of a molding material that may include, for example, a Novolac-based resin, an epoxy-based resin, a silicone-based resin, or another suitable encapsulant. Suitable fillers may also be included, such as powdered $SiO_2$.

Figure 7:
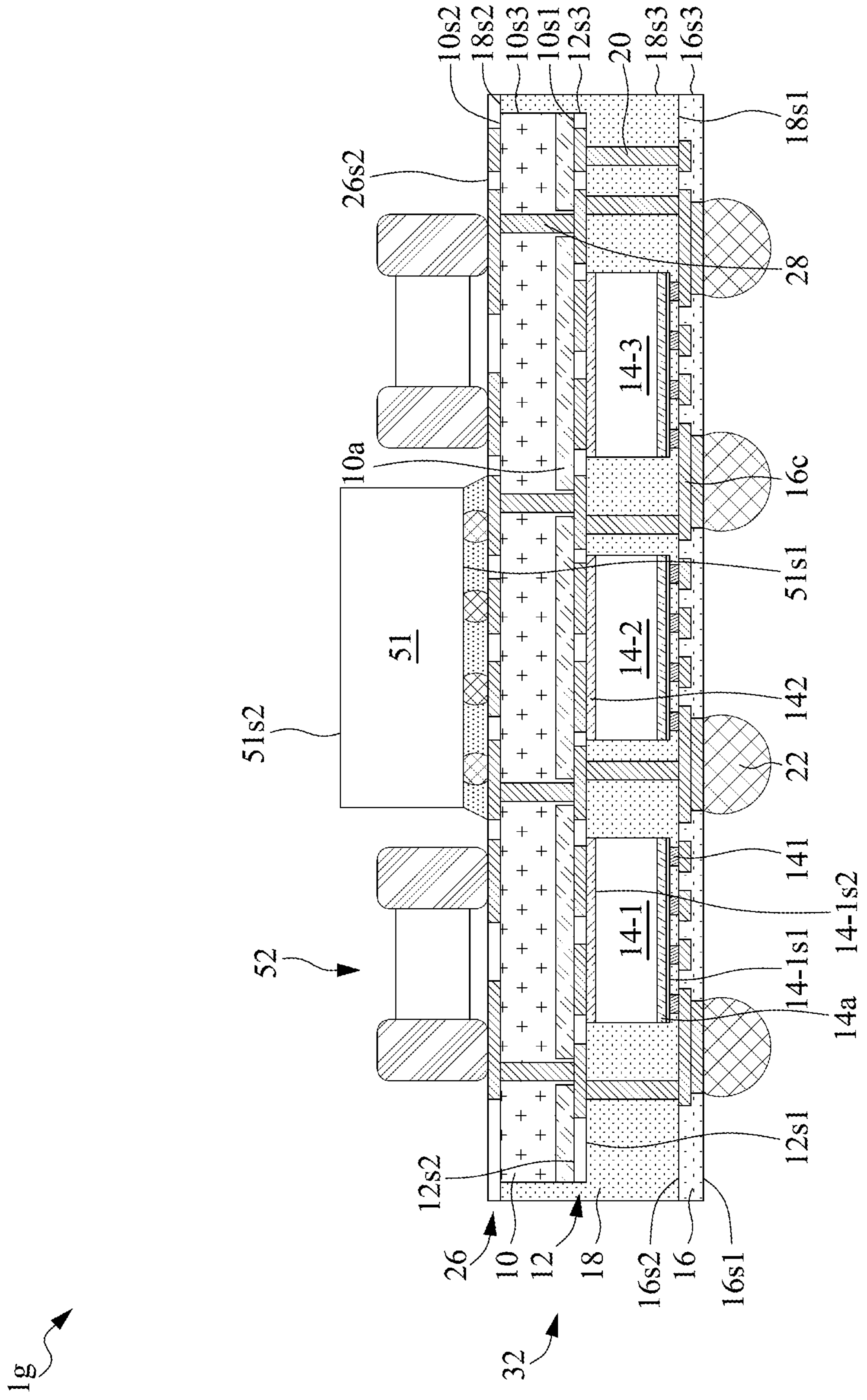
FIG. 7 is a cross-sectional view of an electronic device in accordance with some arrangements of the present disclosure.

FIG. 7 is a cross-sectional view of an electronic device 1*g* in accordance with some arrangements of the present disclosure.

In some arrangements, the electronic device 1*g* may include a device 32, an electronic component 51, and at least one passive component 52. In some arrangements, the structure of the device 32 may be the same as or similar to that of the electronic device 1*e* as shown in FIG. 5.

In some arrangements, the electronic component 51 may be disposed on or over the device 32. The electronic component 51 may be disposed on or over the surface 26*s*2 of the circuit layer 26. The electronic component 51 may be electrically connected to the electronic component 10. The electronic component 51 may include an active component, such as a logic die (e.g., ASIC, AP, SoC, CPU, GPU, microcontroller, etc.), a memory die (e.g., DRAM die, SRAM die, etc.), a power management die (e.g., PMIC die), an RF die, a sensor die, a MEMS die, a signal processing die (e.g., DSP die), a front-end die (e.g., AFE dies) or other active components. The electronic component 51 may include a surface 51*s*1 and a surface 51*s*2. The surface 51*s*1 (or a lower surface) may face the device 32 and function as an active surface, which a signal (e.g., data signal, power signal, and the like) passes through. The surface 51*s*2 (or an upper surface) may be opposite to the surface 51*s*1 and function as a passive surface, which may also be referred to as a backside surface. The electronic component 51 may include one or more conductive pads (not shown) in proximity to, adjacent to, embedded in, and/or exposed by the surface 51*s*1.

The passive component 52 may be disposed on or over the device 32. The passive component 52 may be disposed on or over the surface 26*s*2 of the circuit layer 26. The passive component 52 may be electrically connected to the electronic component 10. The passive component 52 may be electrically connected to the electronic component 51. In some arrangements, the passive component 52 may be configured to regulate a signal (e.g., power signal) transmitted to the electronic components 10, 14-1, 14-2, 14-3, and/or 51. For example, the electronic component 51 may be configured to stabilize a voltage of a signal. In some arrangements, the passive component 52 may include a capacitor, inductor, resistor, filter, or a combination of such components. In some arrangements, the passive component 52 may include a capacitor, such as a deep trench capacitor (DTC), a multi-layer ceramic capacitor (MLCC) or other capacitors, which may be configured to filter high frequency signals and/or low frequency signals.

Figure 8:
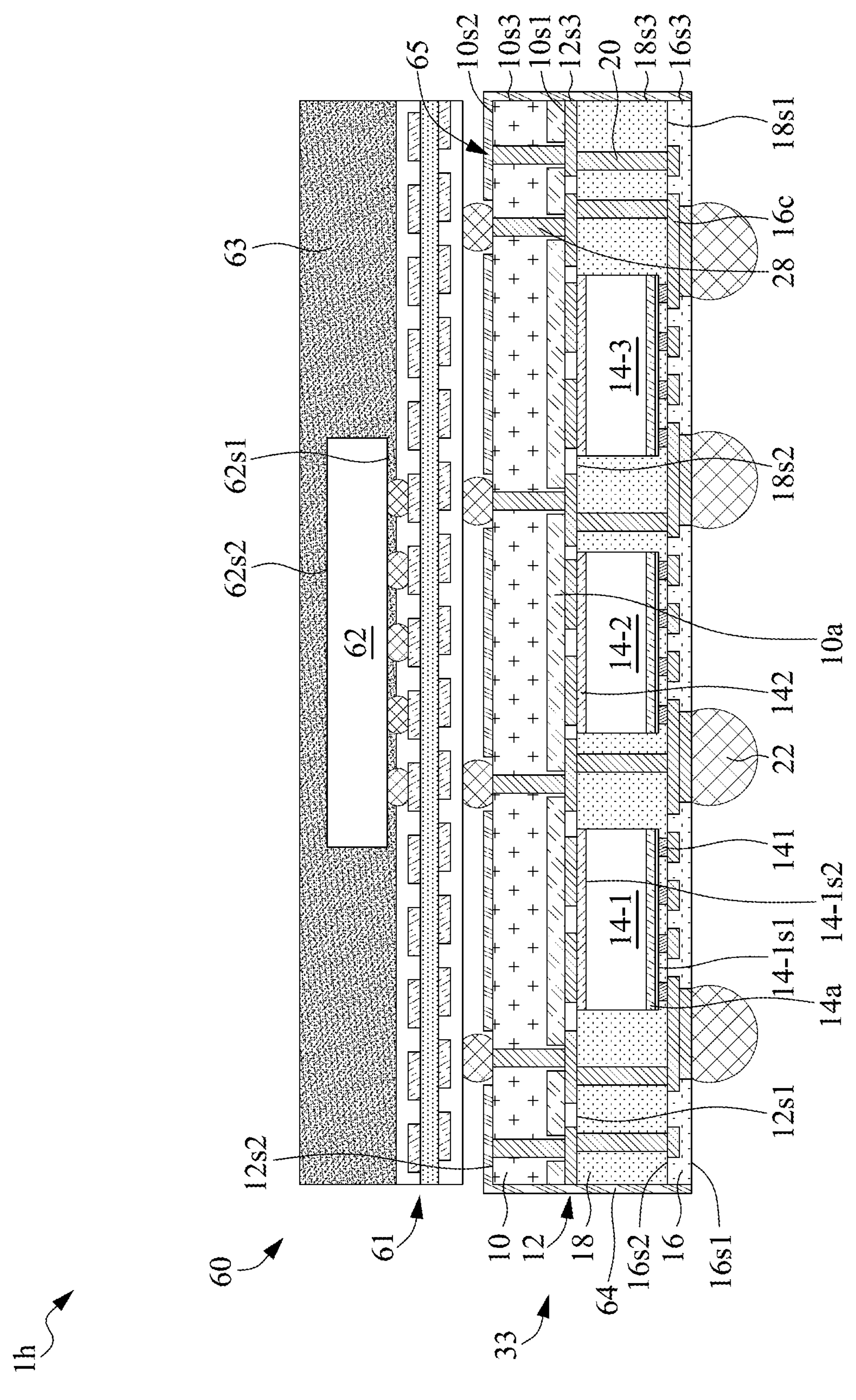
FIG. 8 is a cross-sectional view of an electronic device in accordance with some arrangements of the present disclosure.

FIG. 8 is a cross-sectional view of an electronic device 1*h* in accordance with some arrangements of the present disclosure.

In some arrangements, the electronic device 1*h* may include a device 33 and an antenna package 60. In some arrangements, the device 33 may be similar to the electronic device 1*d* as shown in FIG. 4, and the circuit layer 26 may be omitted from the device 33. In other arrangements, the device 33 may be the same as the electronic device 1*d*.

The antenna package 60 may be disposed on or over the device 33. The antenna package 60 may include an antenna 61, an electronic component 62, and an encapsulant 63.

The antenna 61 may be disposed on or over the device 33. In some arrangements, the antenna 61 may be configured to radiate and/or receive electromagnetic signals, such as RF signals. For example, the antenna 61 may be configured to operate in a frequency between about 10 GHz and about 40 GHz, such as 10 GHz, 20 GHz, 30 GHz, or 40 GHz. In some arrangements, the antenna 61 may be configured to operate in a frequency between about 30 GHz and about 300 GHz. In some arrangements, the antenna 61 may be configured to operate in a frequency between about 300 GHz and about 10 THz. In some arrangements, the antenna 61 may support fifth generation (5G) communications, such as Sub-6 GHz frequency bands and/or millimeter (mm) wave frequency bands. For example, the antenna 61 may incorporate both Sub-6 GHz antennas and mm wave antennas. In some arrangements, the antenna 61 may support beyond-5G or 6G communications, such as terahertz (THz) frequency bands. The antenna 61 may include multiple circuit patterns (not annotated) configured to determine or control the frequency of an RF signal. Said circuit patterns may be disposed within a dielectric structure (not annotated). A redistribution structure (not shown) may be embedded within the dielectric structure for providing an electrical connection (e.g., providing a feed signal).

In some arrangements, the electronic component 62 may be disposed on or over the antenna 61. The electronic component 62 may be electrically connected to the antenna 61. In some arrangements, the electronic component 62 may include an RFIC or other suitable components. The electronic component 62 may have a surface 62*s*1 and a surface 62*s*2. The surface 62*s*1 (or a lower surface) may face the antenna 61 and function as an active surface, which a signal (e.g., data signal, power signal, and the like) passes through. The surface 62*s*2 (or an upper surface) may be opposite to the surface 62*s*1 and function as a passive surface, which may also be referred to as a backside surface. The electronic component 62 may include one or more conductive pads (not shown) in proximity to, adjacent to, embedded in, and/or exposed by the surface 62*s*1. The electronic component 62 may be electrically connected to the antenna 61 by electrical connectors (not annotated), such as solder balls.

In some arrangements, the encapsulant 63 may be disposed on or over the antenna 61. In some arrangements, the encapsulant 63 may encapsulate the electronic component 62. The encapsulant 63 may include insulation or dielectric material. For example, the encapsulant 63 may include a molding compound. In some arrangements, the encapsulant 63 may be made of a molding material that may include, for example, a Novolac-based resin, an epoxy-based resin, a silicone-based resin, or another suitable encapsulant. Suitable fillers may also be included, such as powdered $SiO_2$.

In some arrangements, the electronic device 1*h* may include a shielding layer 64. In some arrangements, the shielding layer 64 may cover the surface 10*s*2 of the electronic component 10. In some arrangements, the shielding layer 64 may cover the surface 10*s*3 of the electronic component 10. In some arrangements, the shielding layer 64 may cover the surface 18*s*3 of the encapsulant 18. In some arrangements, the shielding layer 64 may cover the surface 16*s*3 of the circuit layer 16. In some arrangements, shielding layer 64 may include a portion (not annotated) between the electronic component 10 and the antenna 61 of the antenna package 60. In some arrangements, the shielding layer 64 may be configured to shield the electronic component 10 (or electronic components 14-1, 14-2, and 14-3) from electromagnetic waves from the antenna package 60. Therefore, the electronic component 10 may be free from electromagnetic interference (EMI). The shielding layer 64 may include a conductive material, such as copper (Cu), aluminum (Al), tungsten (W), titanium (Ti), tantalum (Ta), or other applicable materials.

In some arrangements, the device 33 may include a grounding structure 65. The grounding structure 65 may be electrically connected to ground. In some arrangements, the grounding structure 65 may be electrically connected to the shielding layer 64. The grounding structure 65 may be disposed within the electronic component 10, the redistribution structure 12, and the encapsulant 18. For example, the grounding structure 65 may be located at a peripheral region of the electronic component 10, the redistribution structure 12, and the encapsulant 18. In some arrangements, the grounding structure 65 may be closer to the surface 10*s*3 of the electronic component 10 than the through via 28 is. In some arrangements, the grounding structure 65 may surround the through via 28. In some arrangements, the grounding structure 65 may be closer to the surface 18*s*3 of the encapsulant 18 than the conductive element 20 is. In some arrangements, the grounding structure 65 may surround the conductive element 20.

Figure 9:
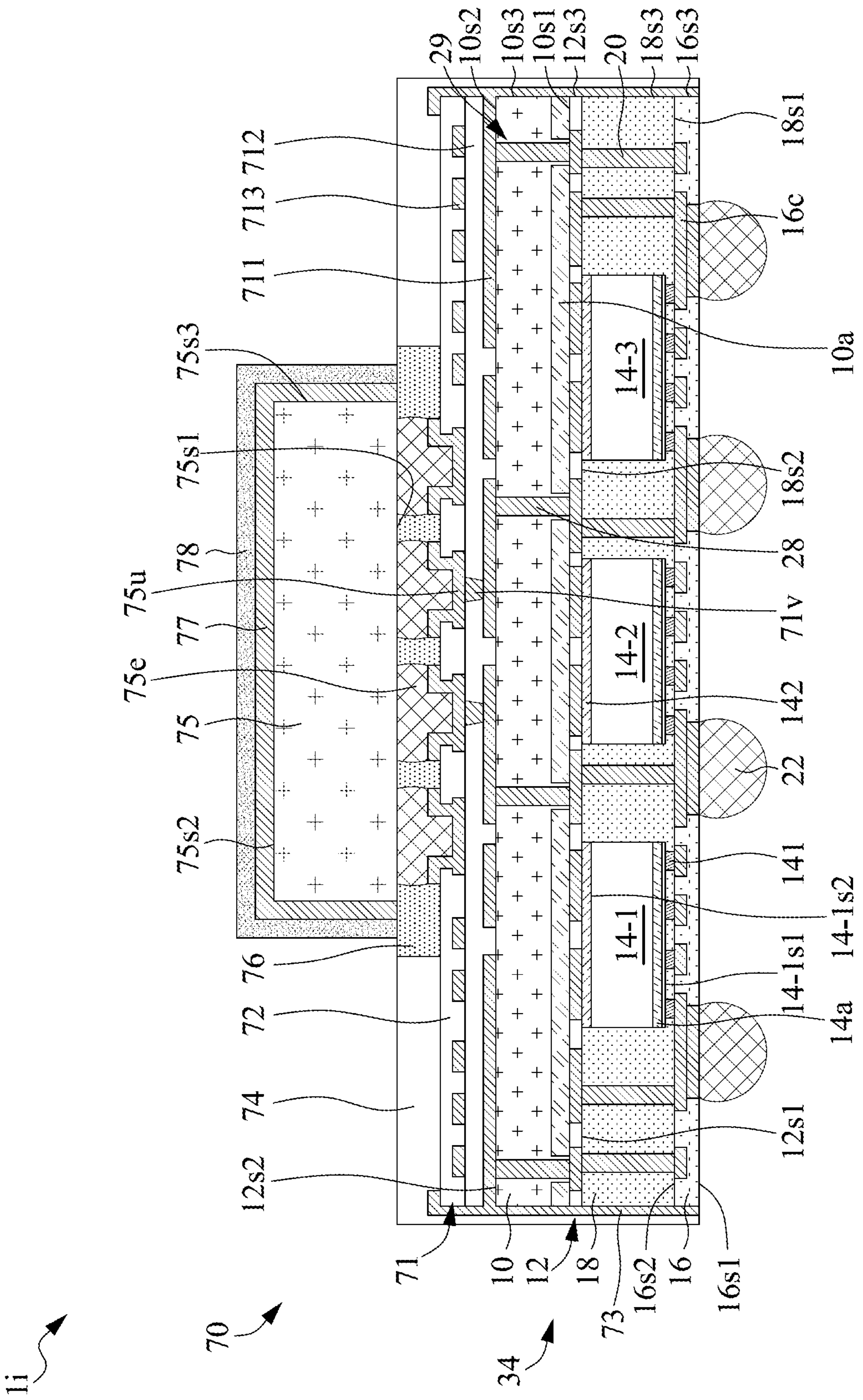
FIG. 9 is a cross-sectional view of an electronic device in accordance with some arrangements of the present disclosure.

FIG. 9 is a cross-sectional view of an electronic device 1*i* in accordance with some arrangements of the present disclosure.

In some arrangements, the electronic device 1*h* may include a device 34 and an antenna device 70. In some arrangements, the device 34 may be similar to the electronic device 1*d* as shown in FIG. 4, and the circuit layer 26 may be omitted from the device 34. In other arrangements, the device 34 may be the same as the electronic device 1*d*.

The antenna device 70 may be disposed on or over the device 34. The antenna device 70 may include a grounding structure 29, an antenna 71, and an electronic component 75.

The grounding structure 29 may be electrically connected to ground. The grounding structure 29 may be disposed within the electronic component 10, the redistribution structure 12, and the encapsulant 18. For example, the grounding structure 29 may be located at a peripheral region of the electronic component 10, the redistribution structure 12, and the encapsulant 18. In some arrangements, the grounding structure 29 may be closer to the surface 10*s*3 of the electronic component 10 than the through via 28 is. In some arrangements, the grounding structure 29 may surround the through via 28. In some arrangements, the grounding structure 29 may be closer to the surface 18*s*3 of the encapsulant 18 than the conductive element 20 is. In some arrangements, the grounding structure 29 may surround the conductive element 20.

The antenna 71 may be disposed on or over the device 34. In some arrangements, the antenna 71 may be configured to radiate and/or receive electromagnetic signals, such as RF signals. For example, the antenna 71 may be configured to operate in a frequency between about 10 GHz and about 40 GHz, such as 10 GHz, 20 GHz, 30 GHz, or 40 GHz. In some arrangements, the antenna 61 may be configured to operate in a frequency between about 30 GHz and about 300 GHz. In some arrangements, the antenna 71 may be configured to operate in a frequency between about 300 GHz and about 10 THz. In some arrangements, the antenna 71 may support fifth generation (5G) communications, such as Sub-6 GHz frequency bands and/or millimeter (mm) wave frequency bands. For example, the antenna 71 may incorporate both Sub-6 GHz antennas and mm wave antennas. In some arrangements, the antenna 71 may support beyond-5G or 6G communications, such as terahertz (THz) frequency bands.

The antenna 71 may include a circuit pattern 711, a dielectric structure 712, and a circuit pattern 713. The circuit pattern 711 may be disposed on or over the surface 10*s*2 of the electronic component 10. The circuit pattern 711 may be electrically connected to the grounding structure 29.

The dielectric structure 712 may be disposed between the circuit patterns 711 and 713. The dielectric structure 712 may include a dielectric material, such as polyimide or other suitable materials.

The circuit pattern 713 may be disposed on or over the circuit pattern 711. The arrangements of the circuit patterns 711 and 713 may be configured to determine or control the frequency of an RF signal.

A dielectric structure 72 may be disposed on or over the dielectric structure 712. The dielectric structure 72 may cover the circuit pattern 713. The dielectric structure 72 may include one or more dielectric layers. The dielectric structure 72 may include a dielectric material, such as polyimide or other suitable materials.

A shielding layer 73 may be disposed on or over the upper surface (not annotated) of the dielectric structure 72 and the lateral surface (not annotated) of the dielectric structure 72. In some arrangements, the shielding layer 73 may cover the surface 10*s*3 of the electronic component 10. In some arrangements, the shielding layer 73 may cover the surface 18*s*3 of the encapsulant 18. In some arrangements, the shielding layer 73 may cover the surface 16*s*3 of the circuit layer 16. In some arrangements, the shielding layer 73 may be configured to shield the electronic component 10 (or electronic components 14-1, 14-2, and 14-3) from electromagnetic waves from the antenna 71. The shielding layer 73 may include a conductive material, such as copper (Cu), aluminum (Al), tungsten (W), titanium (Ti), tantalum (Ta), or other applicable materials. In some arrangements, the shielding layer 73 may be electrically connected to the circuit pattern 711 of the antenna 71. In some arrangements, the shielding layer 73 may be electrically connected to ground. In some arrangements, the shielding layer 73 may be configured to function as a reference ground of the antenna 71.

A dielectric structure 74 may be disposed on or over the shielding layer 73. The dielectric structure 74 may cover the shielding layer 73. The dielectric structure 74 may cover the dielectric structure 72. The dielectric structure 74 may include a dielectric material, such as polyimide or other suitable materials.

In some arrangements, the electronic component 75 may be disposed on or over the antenna 71. The electronic component 75 may be electrically connected to the antenna 71. For example, the electronic component 75 may be electrically connected to the antenna 71 by electrical connectors 75*e*, conductive layers 75*u*, and conductive vias 71*v*. The electrical connectors 75*e* may include, for example, solder materials. The conductive layer 75*u* may function as a under bump metallization (UBM). The conductive via 71*v* may be disposed between the circuit pattern 711 and the conductive layer 75*u*. In some arrangements, the electronic component 75 may include an RFIC or other suitable components. The electronic component 75 may have a surface 75*s*1, a surface 75*s*2, and a surface 75*s*3. The surface 75*s*1 (or a lower surface) may face the antenna 71 and function as an active surface, which a signal (e.g., data signal, power signal, and the like) passes through. The surface 75*s*2 (or an upper surface) may be opposite to the surface 75*s*1 and function as a passive surface, which may also be referred to as a backside surface. The surface 75*s*3 may extend between the surfaces 75*s*1 and 75*s*2. The electronic component 75 may include one or more conductive pads (not shown) in proximity to, adjacent to, embedded in, and/or exposed by the surface 75*s*1. The electronic component 75 may be electrically connected to the antenna 71 by electrical connectors (not annotated), such as solder balls.

In some arrangements, a redistribution structure (not annotated) may electrically connect the electronic component 75 and the device 34. The redistribution structure may be disposed within or adjacent to the dielectric structure 72. The redistribution structure may be surrounded by the antenna 71.

A filler 76 may be disposed on or over the dielectric structure 72. The filler 76 may encapsulate the electrical connectors (e.g., solder balls) between the antenna 71 and the electronic component 75. The filler 76 may include, for example, an underfill or other suitable components. The filler 76 may cover the electrical connectors 75*e* and the conductive layers 75*u*.

A shielding layer 77 may be disposed on or over the filler 76. In some arrangements, the shielding layer 77 may cover the surface 75_s_2 of the electronic component 75. In some arrangements, the shielding layer 77 may cover the surface 75_s_3 of the electronic component 75. In some arrangements, the shielding layer 77 may be configured to shield the electronic component 75 from EMI. The shielding layer 77 may include a conductive material, such as copper (Cu), aluminum (Al), tungsten (W), titanium (Ti), tantalum (Ta), or other applicable materials.

A protection layer 78 may be disposed on or over the filler 76. The protection layer 78 may cover the shielding layer 77 to protect the shielding layer 77 from damage from the environment. The protection layer 78 may include a dielectric material, such as a polyimide, a phenolic compound or material, or other suitable materials.

Figure 10:
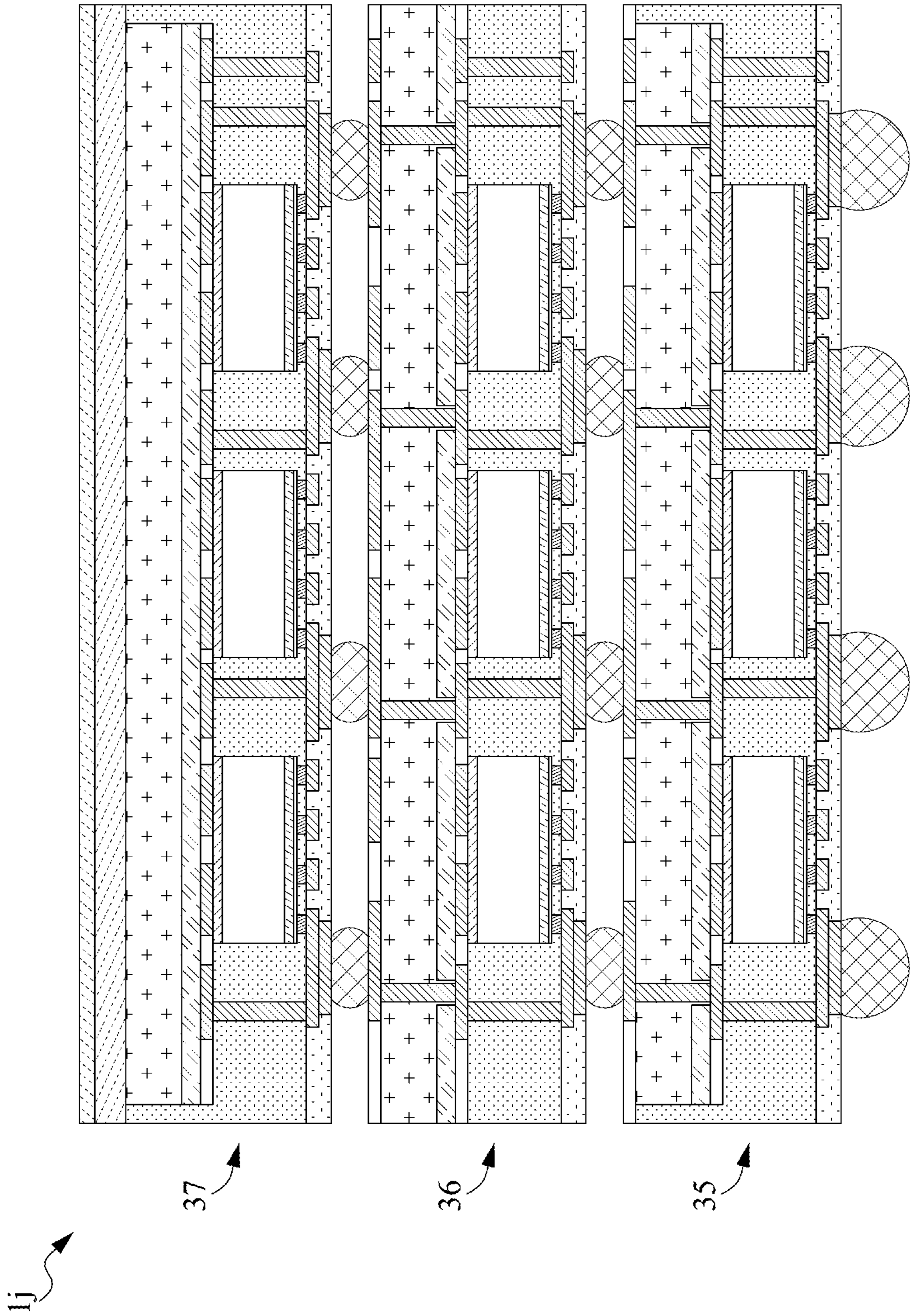
FIG. 10 is a cross-sectional view of an electronic device in accordance with some arrangements of the present disclosure.

FIG. 10 is a cross-sectional view of an electronic device 1_j_ in accordance with some arrangements of the present disclosure. The electronic device 1_j_ may include a device 35, a device 36, and a device 37. In some arrangements, the device 35 may be the same as or similar to the electronic device 1_e_ as shown in FIG. 5. In some arrangements, the device 36 may be the same as or similar to the electronic device 1_d_ as shown in FIG. 4. In some arrangements, the device 37 may be the same as or similar to the electronic device 1_c_ as shown in FIG. 3. The device 35 may be electrically connected to the devices 36 and 37. The devices 35, 36, and 37 may be vertically stacked.

FIG. 11A to FIG. 11H illustrates various stages of an example of a method for manufacturing an electronic device according to some arrangements of the present disclosure.

Figure 11A:
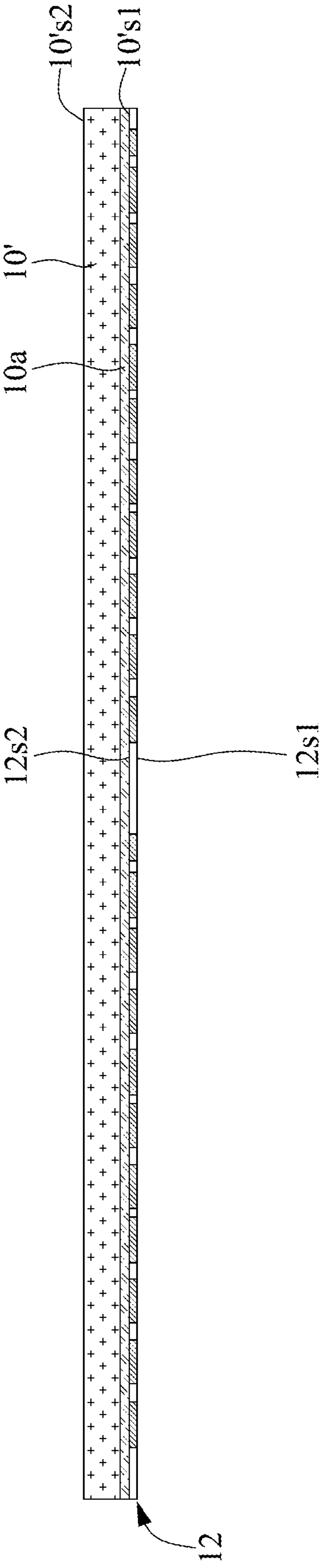
FIG. 11A illustrates one or more stages of an example of a method for manufacturing an electronic device according to some arrangements of the present disclosure.

Referring to FIG. 11A, a substrate 10' may be provided. The substrate 10' may include, for example, a wafer. The substrate 10' may include a plurality of units (not annotated), each of which may correspond to a die. The substrate 10' may be sawed into multiple dies after a singulation technique is performed. The substrate 10' may include a surface 10'_s_1 and a surface 10'_s_2 opposite to the surface 10'_s_1. Multiple ICs (not shown) may be formed adjacent to the surface 10'_s_1 of the substrate 10'. A redistribution structure 12 may be formed on the surface 10'_s_1 of the substrate 10'.

Figure 11B:
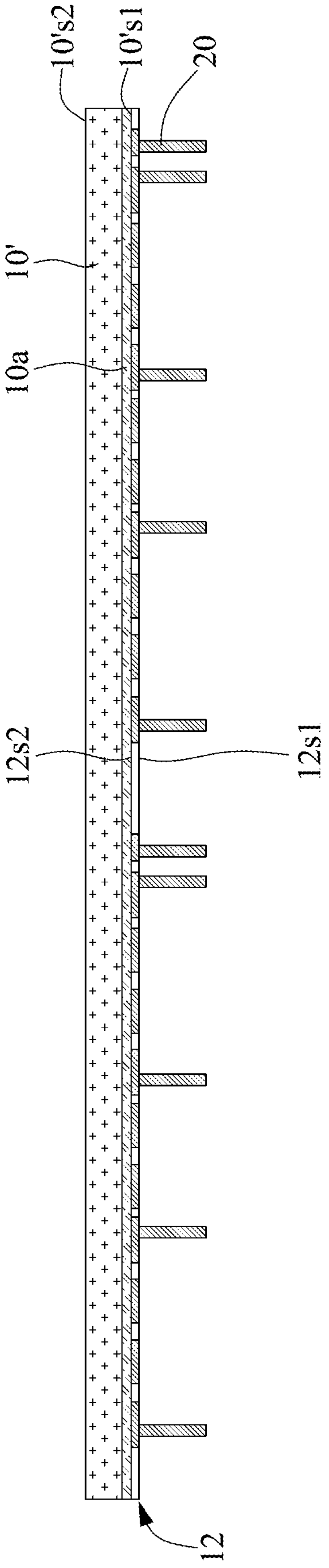
FIG. 11B illustrates one or more stages of an example of a method for manufacturing an electronic device according to some arrangements of the present disclosure.

Referring to FIG. 11B, at least one conductive element 20 may be formed under the surface 12_s_1 of the redistribution structure 12. In some arrangements, a photosensitive material (not shown) may be formed over the redistribution structure 12. The photosensitive material may be patterned by, for example, a lithography technique to form at least one opening penetrating the photosensitive material. Next, a seed layer may be formed within the opening and on the redistribution structure 12, and then a conductive material may be formed on the seed layer to produce the conductive element 20.

Figure 11C:
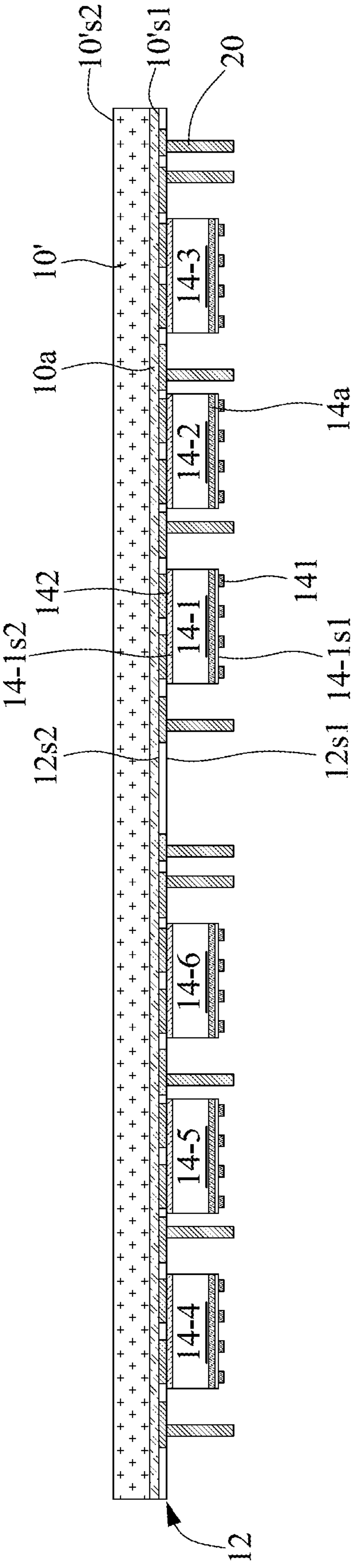
FIG. 11C illustrates one or more stages of an example of a method for manufacturing an electronic device according to some arrangements of the present disclosure.

Referring to FIG. 11C, electronic components 14-1, 14-2, 14-3, 14-4, 14-5, and 14-6 may be mounted under the surface 12_s_1 of the redistribution structure 12. Each of the electronic components 14-4, 14-5, and 14-6 may be the same as or similar to the electronic component 14-1.

Figure 11D:
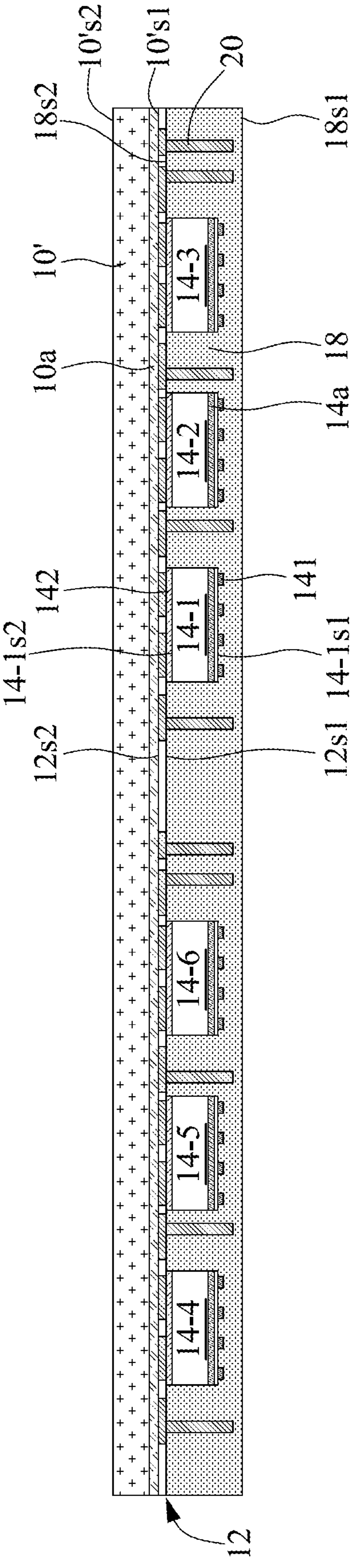
FIG. 11D illustrates one or more stages of an example of a method for manufacturing an electronic device according to some arrangements of the present disclosure.

Referring to FIG. 11D, an encapsulant 18 may be formed under the surface 12_s_1 of the redistribution structure 12 to cover the electronic components 14-1 to 14-6 and the conductive element 20.

Figure 11E:
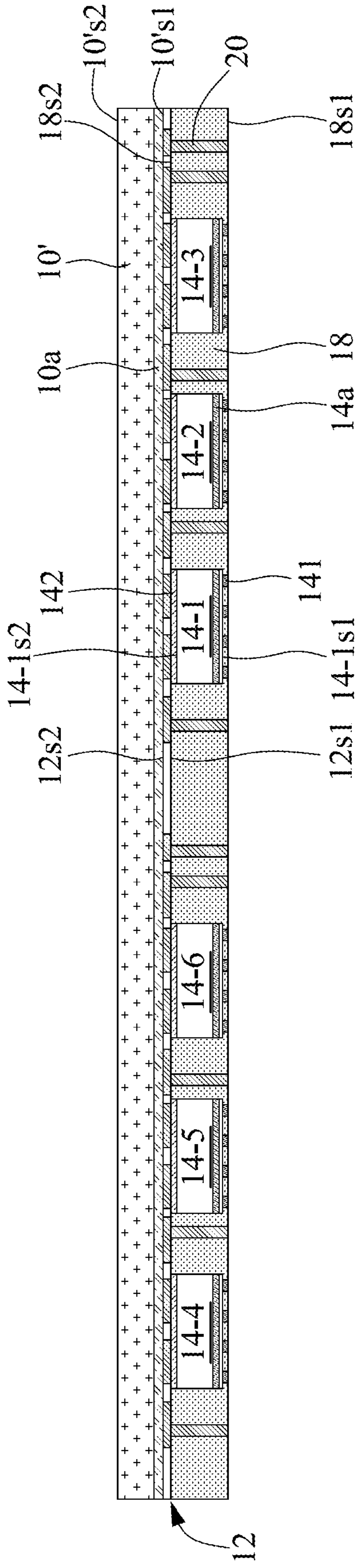
FIG. 11E illustrates one or more stages of an example of a method for manufacturing an electronic device according to some arrangements of the present disclosure.

Referring to FIG. 11E, the surface 18_s_1 of the encapsulant 18 may be grinded. In some arrangements, the terminals 141 may be grinded. In some arrangements, the conductive element 20 may be grinded. As a result, the terminals 141 of the electronic components 14-1 to 14-6 may be exposed by the surface 18_s_1 of the encapsulant 18. The conductive element 20 (e.g., the lower surface of the conductive element 20) may be exposed by the surface 18_s_1 of the encapsulant 18.

Figure 11F:
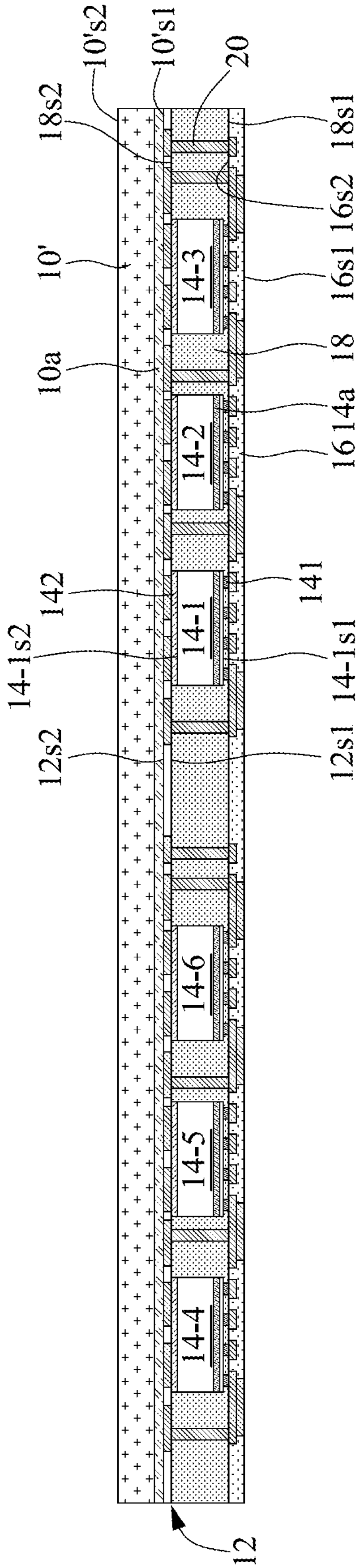
FIG. 11F illustrates one or more stages of an example of a method for manufacturing an electronic device according to some arrangements of the present disclosure.

Referring to FIG. 11F, a circuit layer 16 may be formed under the surface 18_s_1 of the encapsulant 18 to electrically connect the conductive element 20.

Figure 11G:
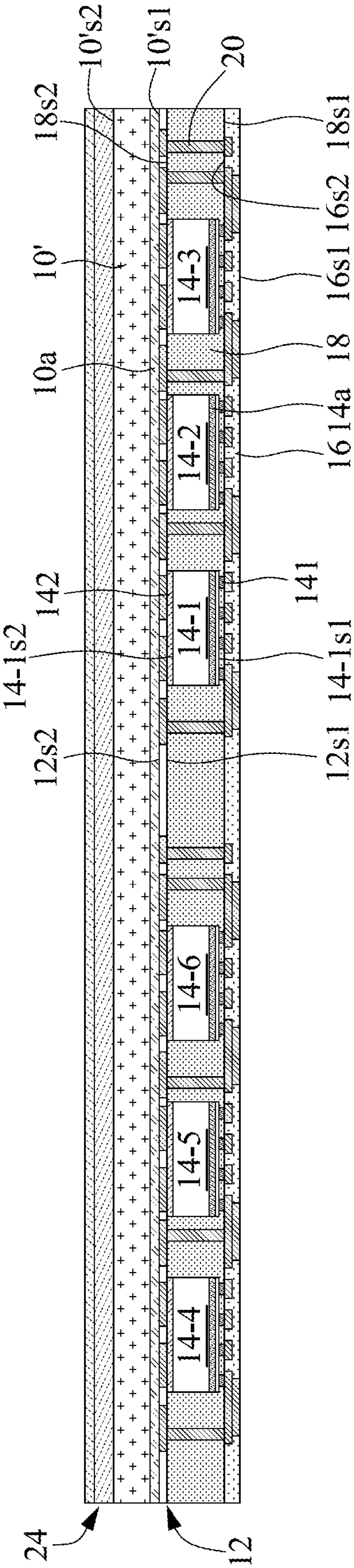
FIG. 11G illustrates one or more stages of an example of a method for manufacturing an electronic device according to some arrangements of the present disclosure.

Referring to FIG. 11G, a heat dissipating element 24 may be formed over the surface 10'_s_2 of the substrate 10'. For example, one or more metallic materials may be plated over the surface 10'_s_2 of the substrate 10' to form the heat dissipating element 24.

Figure 11H:
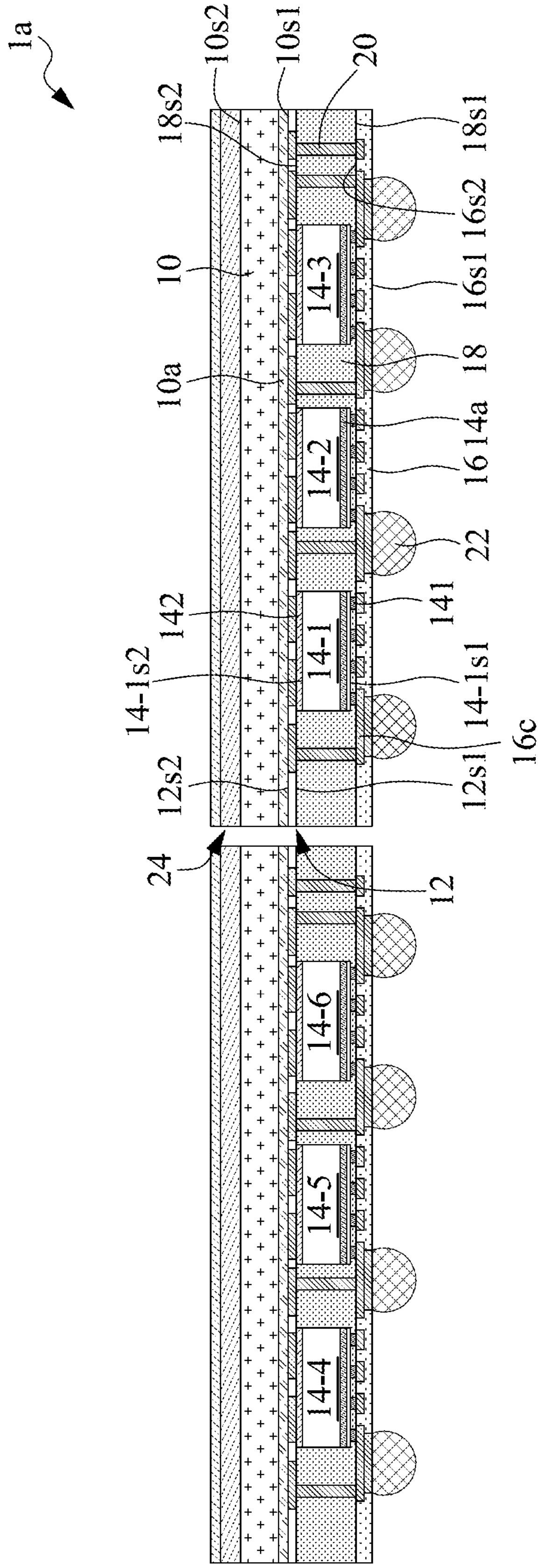
FIG. 11H illustrates one or more stages of an example of a method for manufacturing an electronic device according to some arrangements of the present disclosure.

Referring to FIG. 11H, electrical connectors 22 may be formed under the surface 18_s_1 of the encapsulant 18. Next, a singulation technique may be performed on the substrate 10'. The electronic components 14-1 to 14-3 and the electronic components 14-4 to 14-6 may be integrated on respective electronic components 10. As a result, multiple electronic devices, such as the electronic device 1_a_ as shown in FIG. 1, may be produced.

Figure 12A:
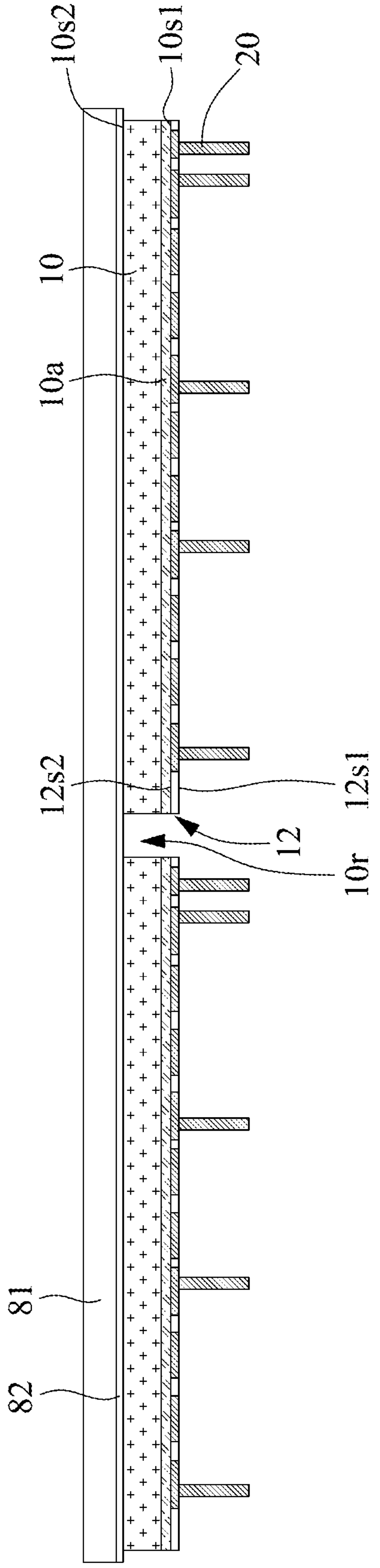
FIG. 12A illustrates one or more stages of an example of a method for manufacturing an electronic device according to some arrangements of the present disclosure.

FIG. 12A to FIG. 12G illustrates various stages of an example of a method for manufacturing an electronic device according to some arrangements of the present disclosure. FIG. 12A depicts a stage subsequent to that depicted in FIG. 11A.

Referring to FIG. 12A, at least one conductive element 20 may be formed under the surface 12_s_1 of the redistribution structure 12. The substrate 10' may be sawed to form electronic components 10. The surface 10_s_2 of the electronic component 10 may be attached to a carrier 81. The carrier 81 may include a silicon carrier, a glass carrier, a ceramic carrier, or other suitable carriers. A release film 82 may be configured to attach the electronic component 10 to the carrier 81. A recess 10_r_ may be formed over the carrier 81.

Figure 12B:
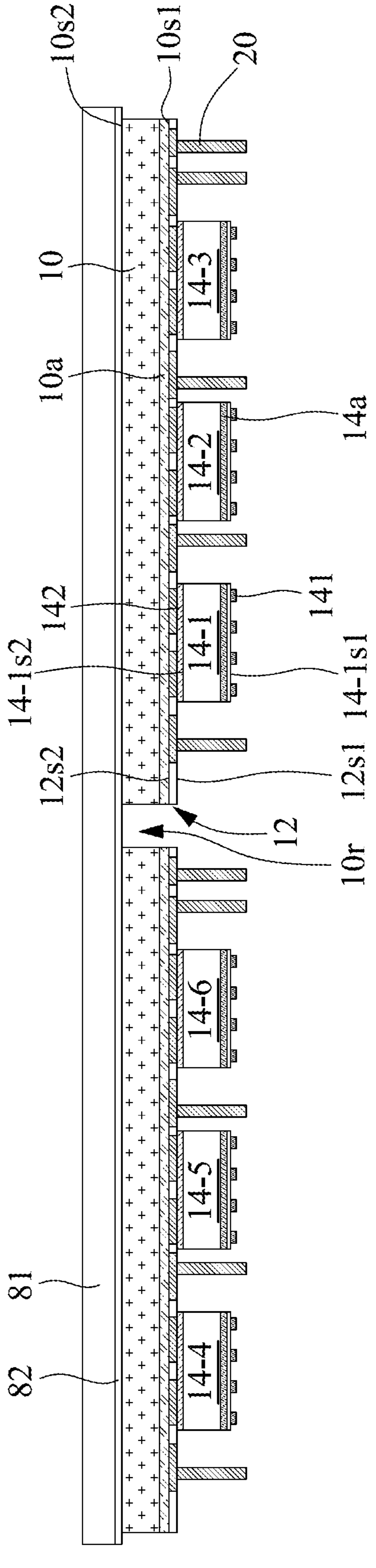
FIG. 12B illustrates one or more stages of an example of a method for manufacturing an electronic device according to some arrangements of the present disclosure.

Referring to FIG. 12B, electronic components 14-1, 14-2, 14-3, 14-4, 14-5, and 14-6 may be mounted under the surface 12_s_1 of the redistribution structure 12 of respective electronic components 10.

Figure 12C:
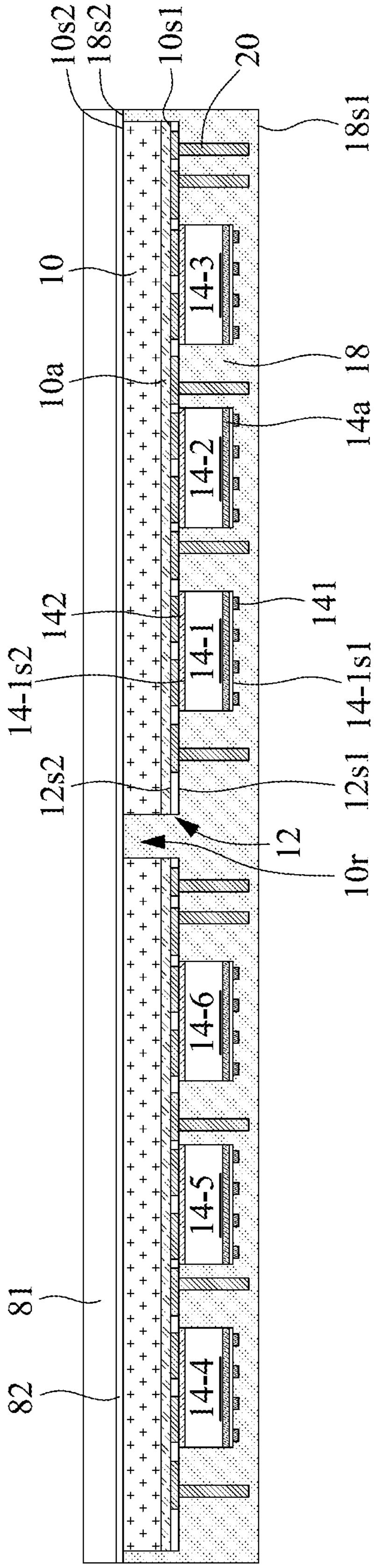
FIG. 12C illustrates one or more stages of an example of a method for manufacturing an electronic device according to some arrangements of the present disclosure.

Referring to FIG. 12C, an encapsulant 18 may be formed under the surface 12_s_1 of the redistribution structure 12 to cover the electronic components 14-1 to 14-6 and the conductive element 20. The encapsulant 18 may fill the recess 10_r_.

Figure 12D:
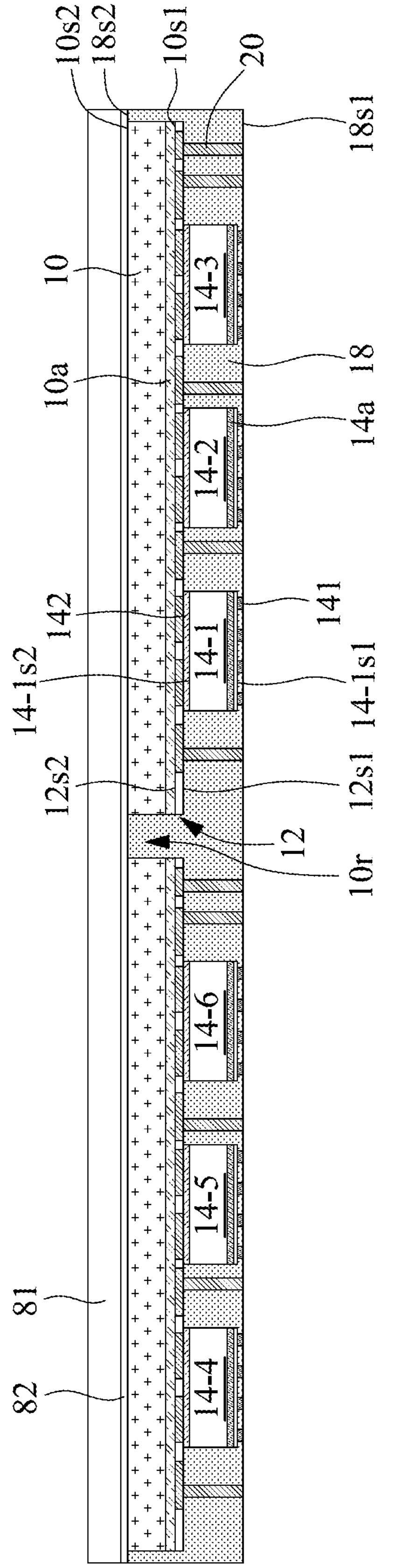
FIG. 12D illustrates one or more stages of an example of a method for manufacturing an electronic device according to some arrangements of the present disclosure.

Referring to FIG. 12D, the surface 18_s_1 of the encapsulant 18 may be grinded. As a result, the terminals 141 of electronic component 14-1 to 14-6 may be exposed by the surface 18_s_1 of the encapsulant 18. The conductive element 20 (e.g., the lower surface of the conductive element 20) may be exposed by the surface 18_s_1 of the encapsulant 18.

Figure 12E:
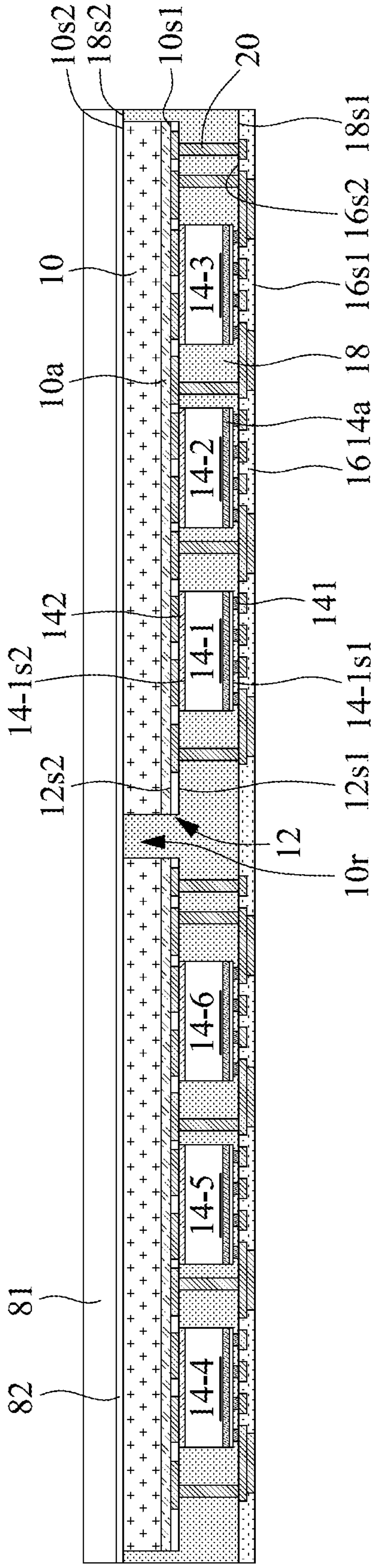
FIG. 12E illustrates one or more stages of an example of a method for manufacturing an electronic device according to some arrangements of the present disclosure.

Referring to FIG. 12E, a circuit layer 16 may be formed under the surface 18_s_1 of the encapsulant 18 to electrically connect the conductive element 20.

Figure 12F:
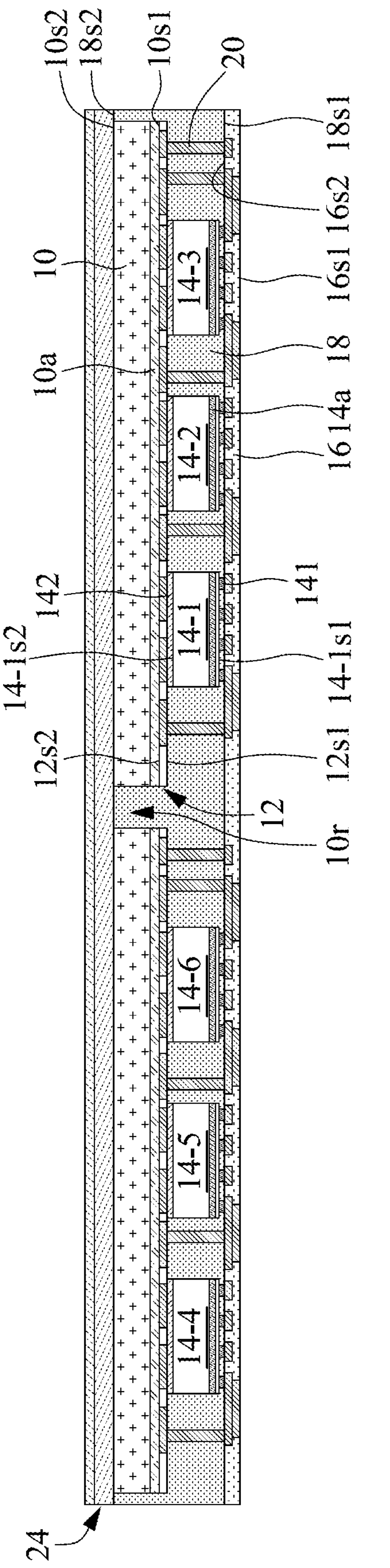
FIG. 12F illustrates one or more stages of an example of a method for manufacturing an electronic device according to some arrangements of the present disclosure.

Referring to FIG. 12F, a heat dissipating element 24 may be formed over the surface 10_s_2 of the electronic component 10. For example, one or more metallic materials may be plated over the surface 10_s_2 of the electronic component 10 to form the heat dissipating element 24. The carrier 81 and the release film 82 may be removed.

Figure 12G:
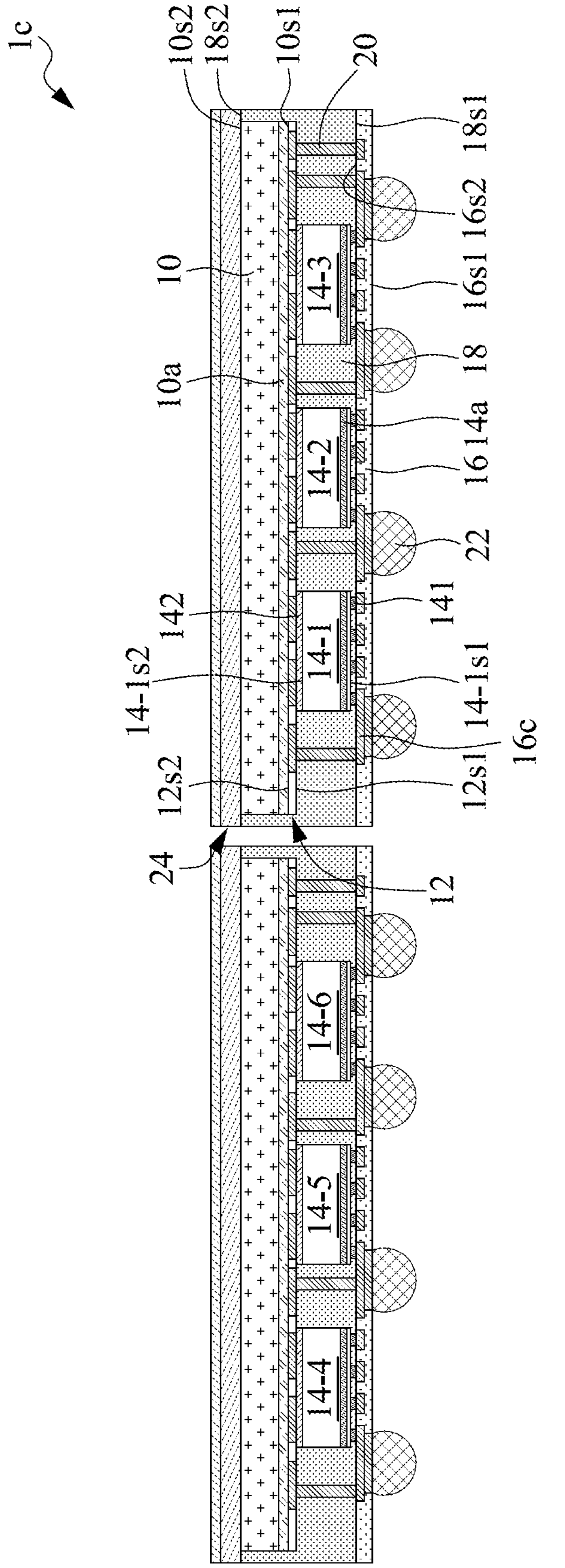
FIG. 12G illustrates one or more stages of an example of a method for manufacturing an electronic device according to some arrangements of the present disclosure.

Referring to FIG. 12G, electrical connectors 22 may be formed under the surface 18_s_1 of the encapsulant 18. Next, a singulation technique may be performed on the recess 10_r_. As a result, multiple electronic devices, such as the electronic device 1_c_ as shown in FIG. 3, may be produced.

FIG. 13A to FIG. 13H illustrates various stages of an example of a method for manufacturing an electronic device according to some arrangements of the present disclosure.

Figure 13A:
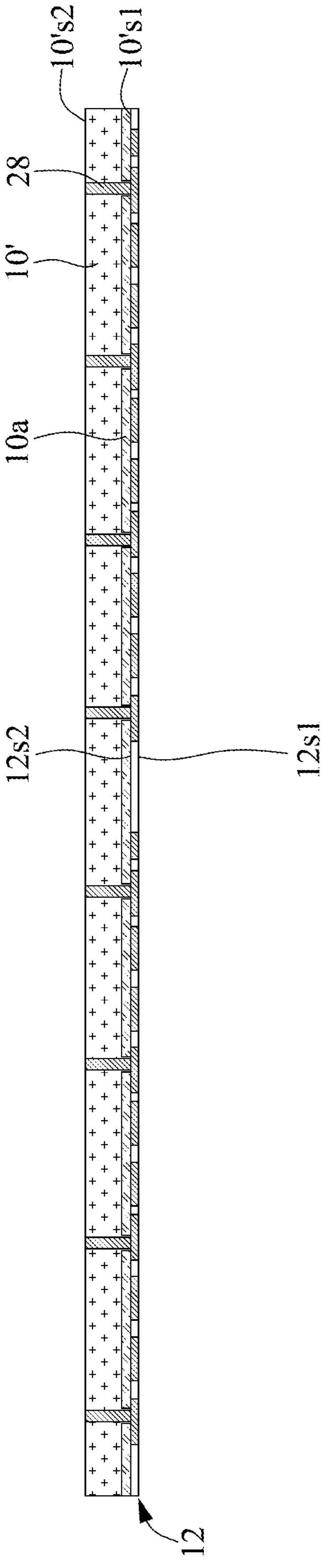
FIG. 13A illustrates one or more stages of an example of a method for manufacturing an electronic device according to some arrangements of the present disclosure.

Referring to FIG. 13A, a substrate 10' may be provided. The substrate 10' may include, for example, a wafer. The substrate 10' may include a plurality of units (not annotated), each of which may correspond to a die. The substrate 10' may be sawed into multiple dies after a singulation technique is performed. The substrate 10' may include a surface **10'*s*1 and a surface 10'*s*2 opposite to the surface 10'*s*1. Multiple ICs (not shown) may be formed adjacent to the surface 10'*s*1 of the substrate 10'. At least one through via 28 may be formed within the substrate 10' and extend between the surfaces 10'*s*1 and 10'*s*2. A redistribution structure 12 may be formed on the surface 10'*s*1 of the substrate 10' and electrically connected to the through via 28**.

Figure 13B:
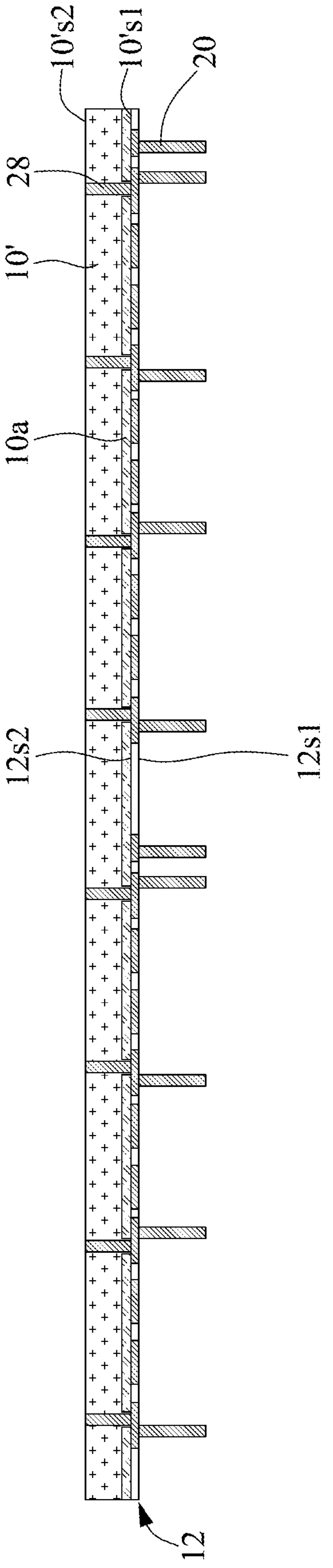
FIG. 13B illustrates one or more stages of an example of a method for manufacturing an electronic device according to some arrangements of the present disclosure.

Referring to FIG. 13B, at least one conductive element 20 may be formed under the surface **12*s*1 of the redistribution structure 12**.

Figure 13C:
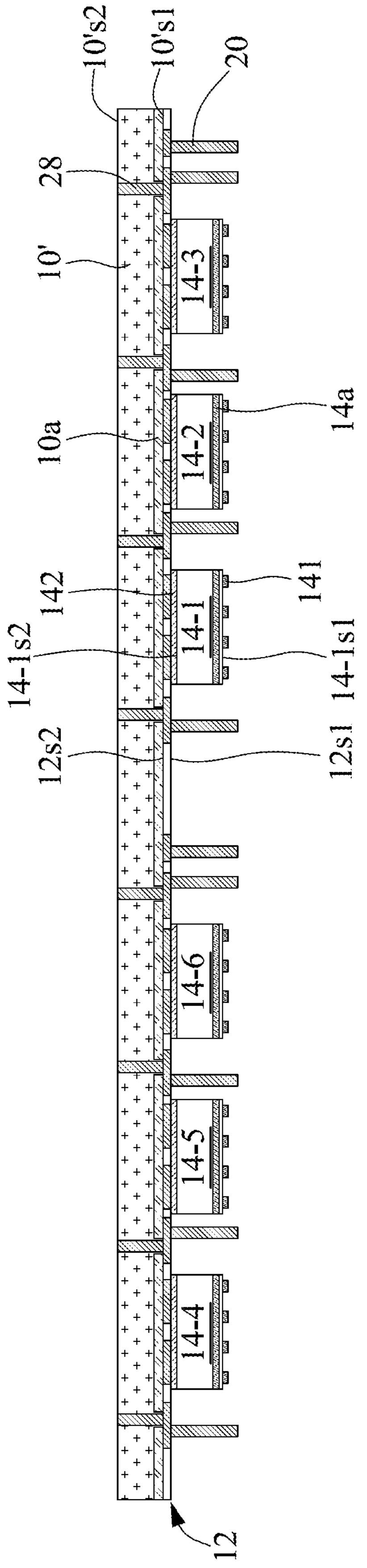
FIG. 13C illustrates one or more stages of an example of a method for manufacturing an electronic device according to some arrangements of the present disclosure.

Referring to FIG. 13C, electronic components 14-1, 14-2, 14-3, 14-4, 14-5, and 14-6 may be mounted under the surface **12*s*1 of the redistribution structure 12. Each of the electronic components 14-4, 14-5, and 14-6 may be the same as or similar to the electronic component 14-1**.

Figure 13D:
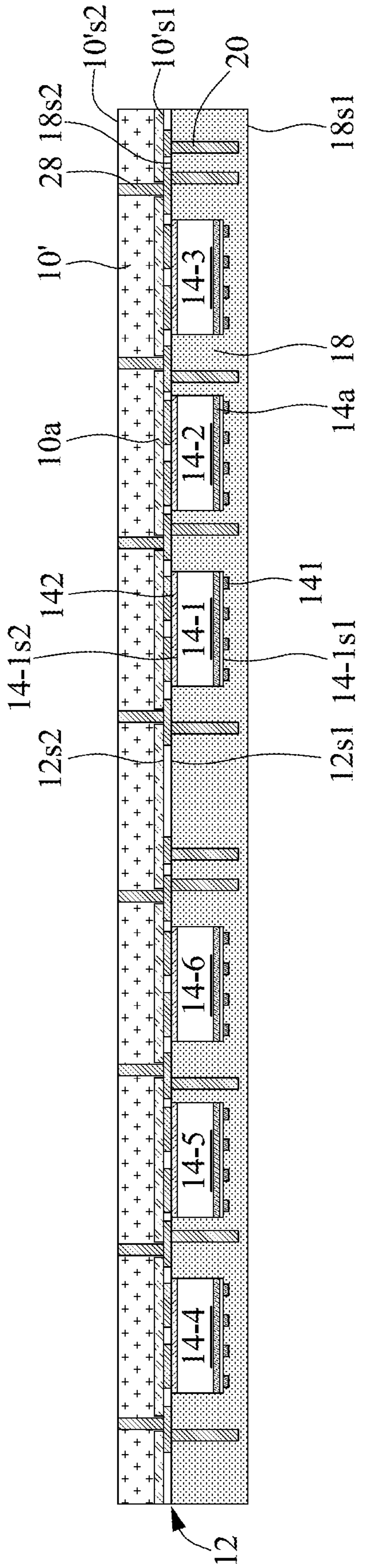
FIG. 13D illustrates one or more stages of an example of a method for manufacturing an electronic device according to some arrangements of the present disclosure.

Referring to FIG. 13D, an encapsulant 18 may be formed under the surface **12*s*1 of the redistribution structure 12 to cover the electronic components 14-1 to 14-6 and the conductive element 20**.

Figure 13E:
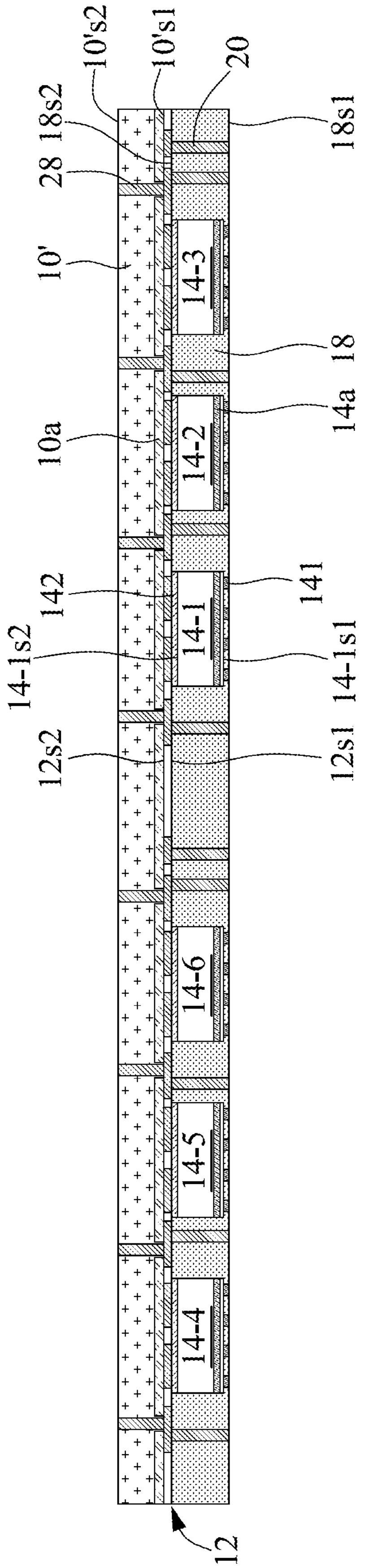
FIG. 13E illustrates one or more stages of an example of a method for manufacturing an electronic device according to some arrangements of the present disclosure.

Referring to FIG. 13E, the surface **18*s*1 of the encapsulant 18 may be grinded. As a result, the terminals 141 of electronic components 14-1 to 14-6 may be exposed by the surface 18*s*1 of the encapsulant 18. The conductive element 20 (e.g., the lower surface of the conductive element 20) may be exposed by the surface 18*s*1 of the encapsulant 18**.

Figure 13F:
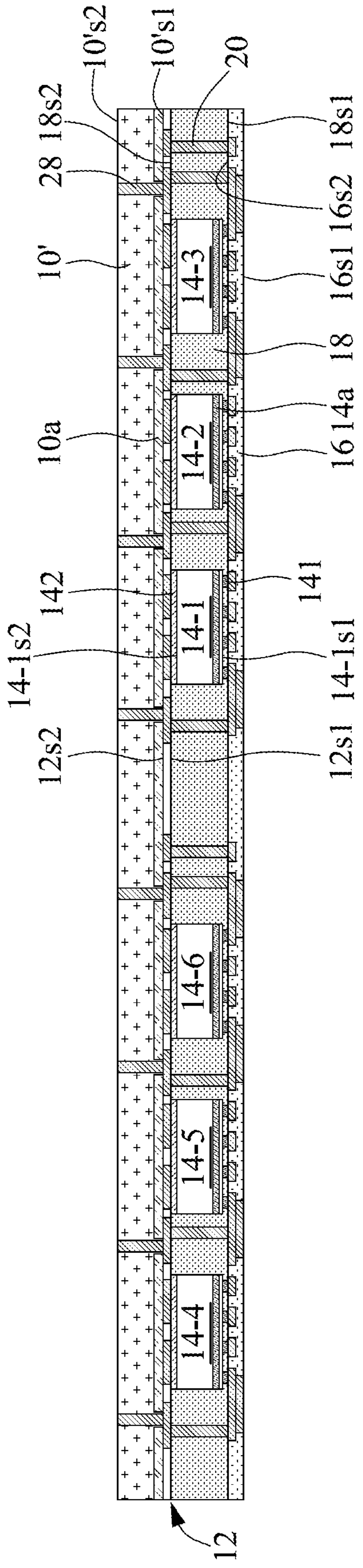
FIG. 13F illustrates one or more stages of an example of a method for manufacturing an electronic device according to some arrangements of the present disclosure.

Referring to FIG. 13F, a circuit layer 16 may be formed under the surface **18*s*1 of the encapsulant 18 to electrically connect the conductive element 20**.

Figure 13G:
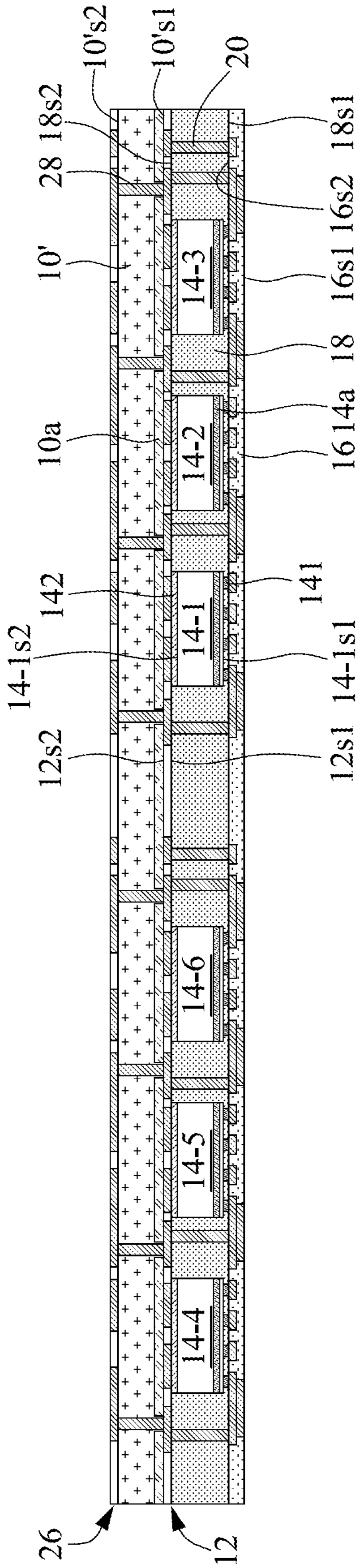
FIG. 13G illustrates one or more stages of an example of a method for manufacturing an electronic device according to some arrangements of the present disclosure.

Referring to FIG. 13G, a circuit layer 26 may be formed over the surface **10'*s*2 of the substrate 10' and electrically connected to the through via 28**.

Figure 13H:
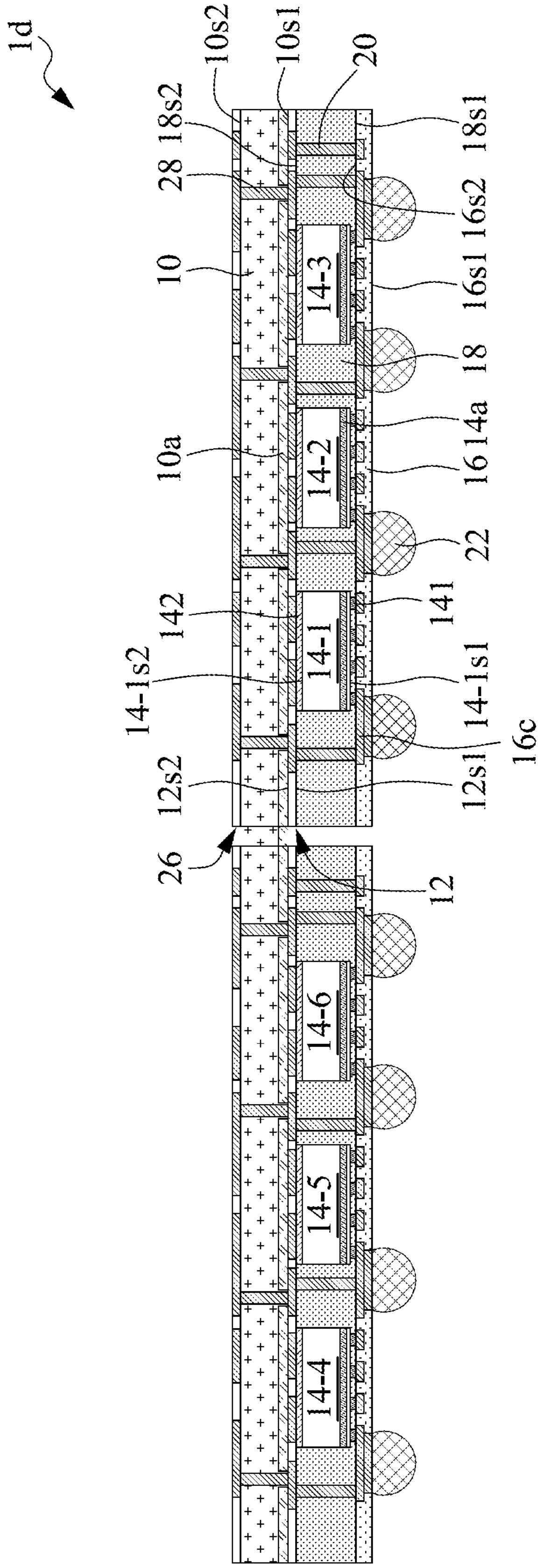
FIG. 13H illustrates one or more stages of an example of a method for manufacturing an electronic device according to some arrangements of the present disclosure.

Referring to FIG. 13H, electrical connectors 22 may be formed under the surface **18*s*1 of the encapsulant 18. Next, a singulation technique may be performed. As a result, multiple electronic devices, such as the electronic device 1*d* as shown in FIG. 4**, may be produced.

Figure 14A:
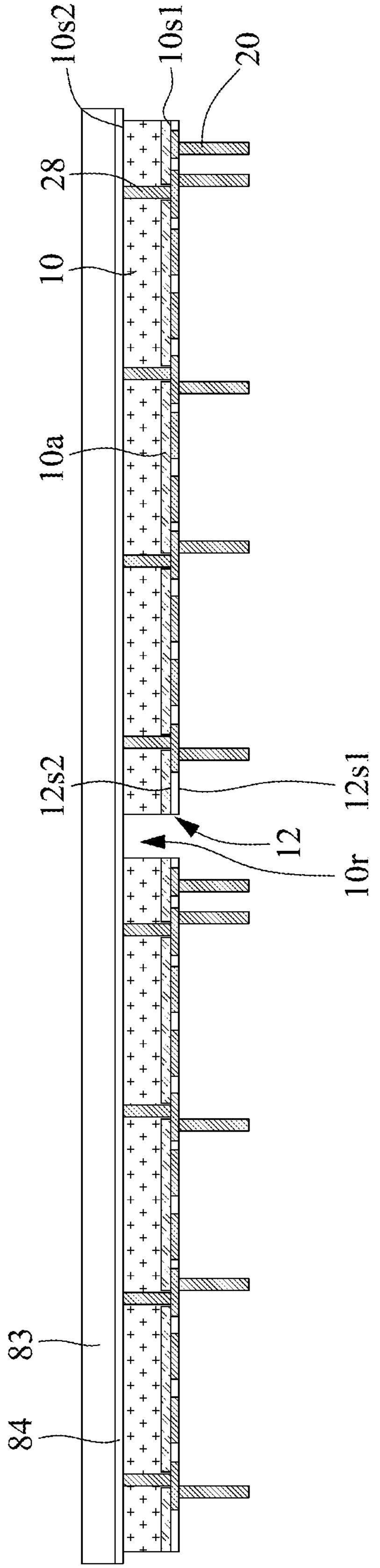
FIG. 14A illustrates one or more stages of an example of a method for manufacturing an electronic device according to some arrangements of the present disclosure.

FIG. 14A to FIG. 14G illustrates various stages of an example of a method for manufacturing an electronic device according to some arrangements of the present disclosure. FIG. 14A depicts a stage subsequent to that depicted in FIG. 13A.

Referring to FIG. 14A, at least one conductive element 20 may be formed under the surface **12*s*1 of the redistribution structure 12 and electrically connected to the through via 28 The substrate 10' may be sawed to form electronic components 10. The electronic components 10 may be attached to a carrier 83. The carrier 83 may include a silicon carrier, a glass carrier, a ceramic carrier, or other suitable carriers. A release film 84 may be configured to attach the electronic components 10 to the carrier 83. A recess 10*r* may be formed over the carrier 83**.

Figure 14B:
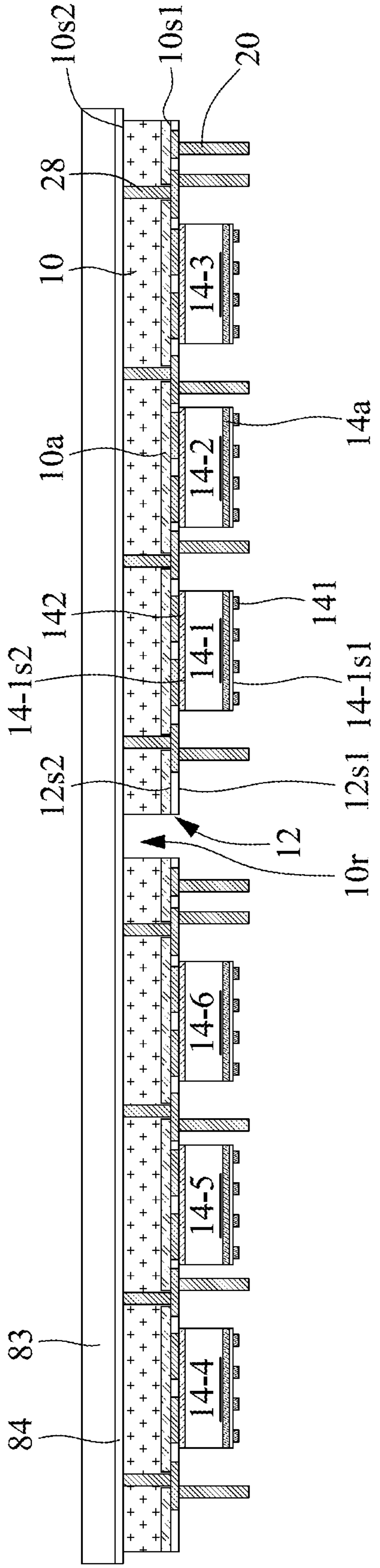
FIG. 14B illustrates one or more stages of an example of a method for manufacturing an electronic device according to some arrangements of the present disclosure.

Referring to FIG. 14B, electronic components 14-1, 14-2, 14-3, 14-4, 14-5, and 14-6 may be mounted under the surface **12*s*1 of the redistribution structure 12. The electronic components 14-1 to 14-3 and the electronic components 14-4 to 14-6 may be separated by the recess 10*r***.

Figure 14C:
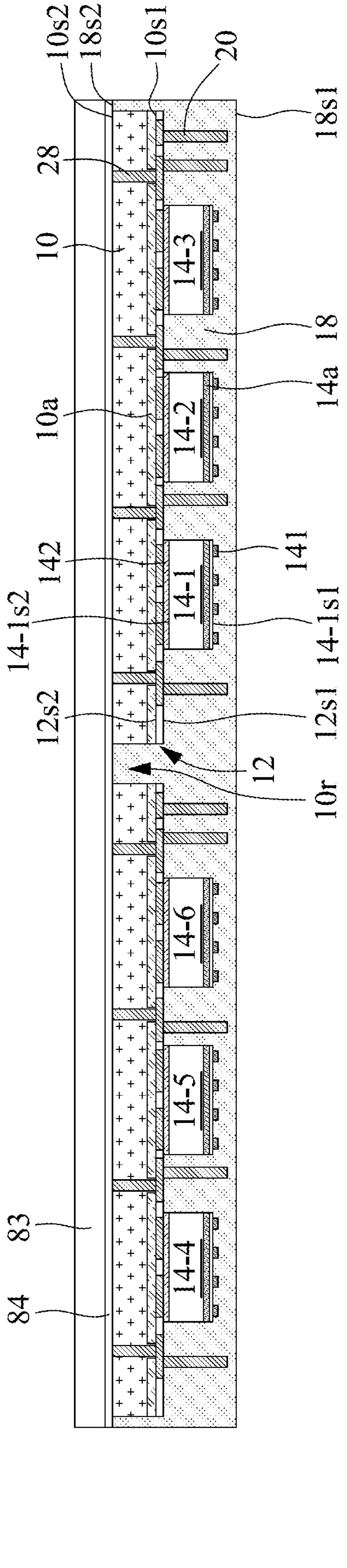
FIG. 14C illustrates one or more stages of an example of a method for manufacturing an electronic device according to some arrangements of the present disclosure.

Referring to FIG. 14C, an encapsulant 18 may be formed under the surface **12*s*1 of the redistribution structure 12 to cover the electronic components 14-1 to 14-6 and the conductive element 20. The encapsulant 18 may fill the recess 10*r***.

Figure 14D:
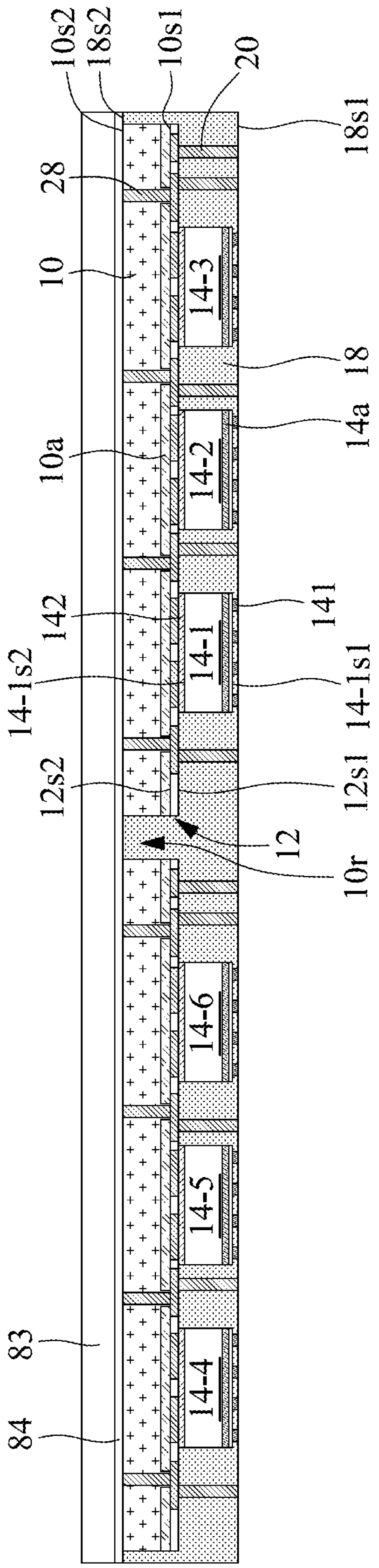
FIG. 14D illustrates one or more stages of an example of a method for manufacturing an electronic device according to some arrangements of the present disclosure.

Referring to FIG. 14D, the surface **18*s*1 of the encapsulant 18 may be grinded. As a result, the terminals 141 of electronic component 14-1 to 14-6 may be exposed by the surface 18*s*1 of the encapsulant 18. The conductive element 20 (e.g., the lower surface of the conductive element 20) may be exposed by the surface 18*s*1 of the encapsulant 18**.

Figure 14E:
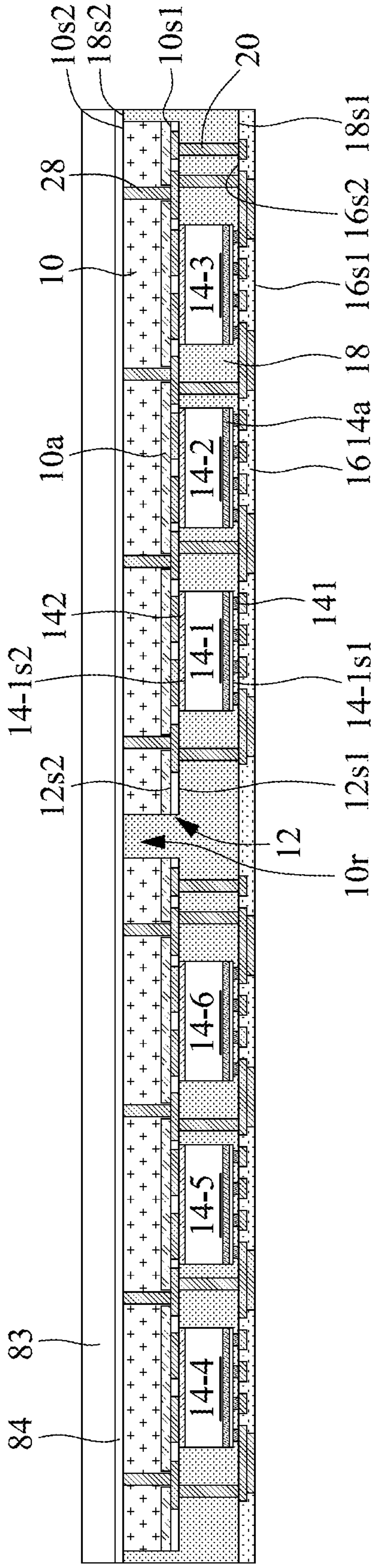
FIG. 14E illustrates one or more stages of an example of a method for manufacturing an electronic device according to some arrangements of the present disclosure.

Referring to FIG. 14E, a circuit layer 16 may be formed under the surface **18*s*1 of the encapsulant 18 to electrically connect the conductive element 20**.

Figure 14F:
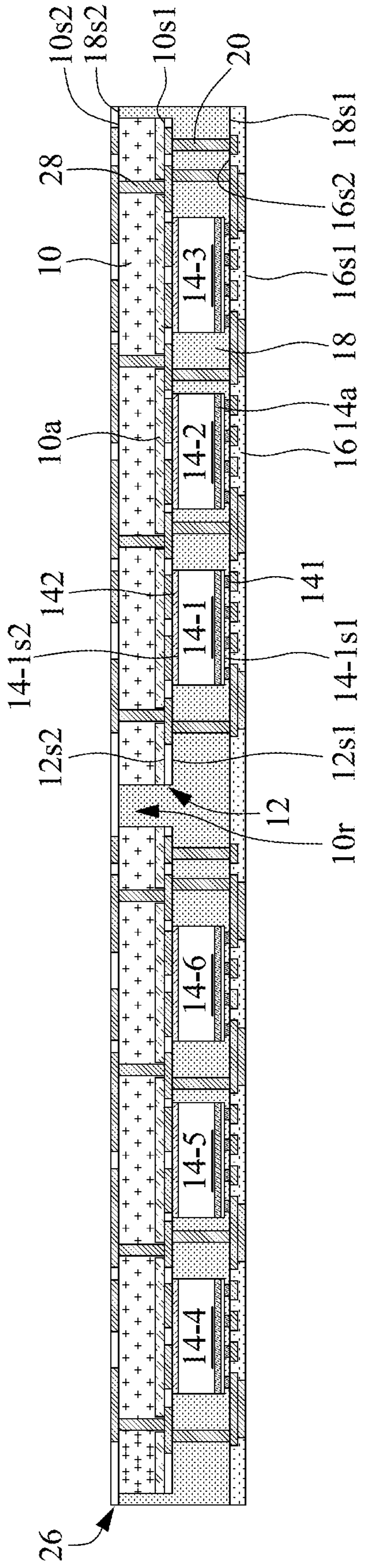
FIG. 14F illustrates one or more stages of an example of a method for manufacturing an electronic device according to some arrangements of the present disclosure.

Referring to FIG. 14F, a circuit layer 26 may be formed over the surface **10*s*2 of the electronic component 10 and electrically connected to the through via 28. The carrier 83 and the release film 84** may be removed.

Figure 14G:
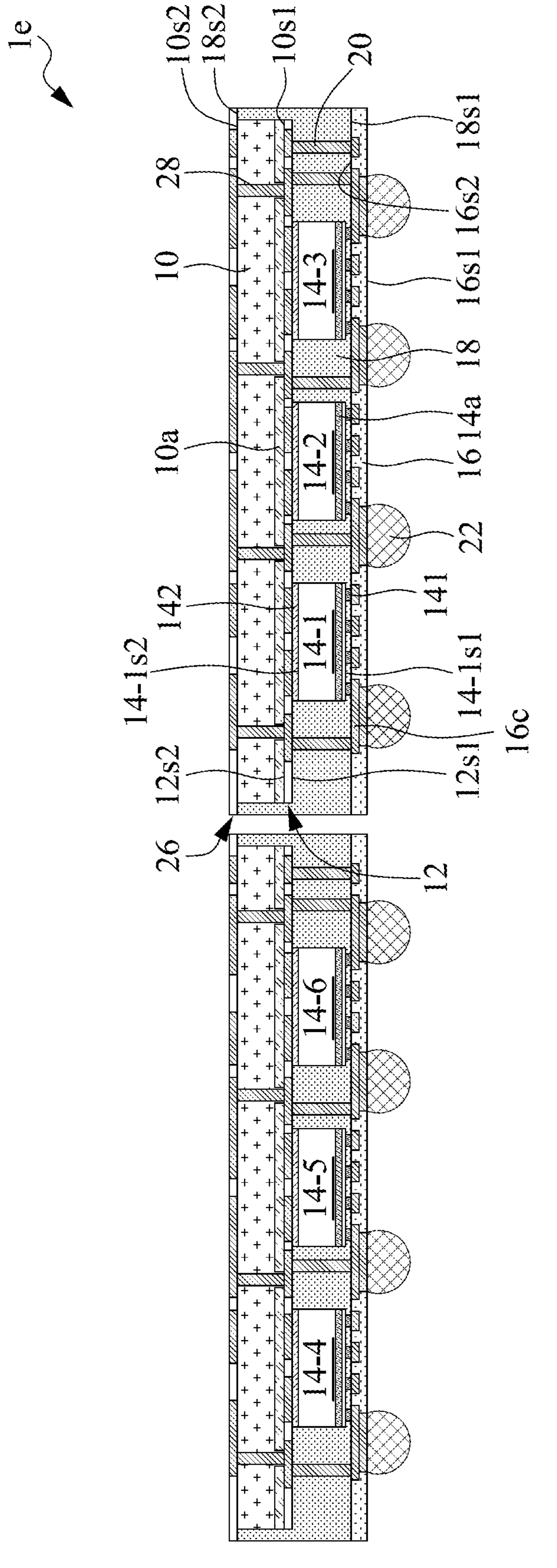
FIG. 14G illustrates one or more stages of an example of a method for manufacturing an electronic device according to some arrangements of the present disclosure.

Referring to FIG. 14G, electrical connectors 22 may be formed under the surface **18*s*1 of the encapsulant 18. Next, a singulation technique may be performed on the recess 10*r*. As a result, multiple electronic devices, such as the electronic device 1*e* as shown in FIG. 5**, may be produced.

Figure 15A:
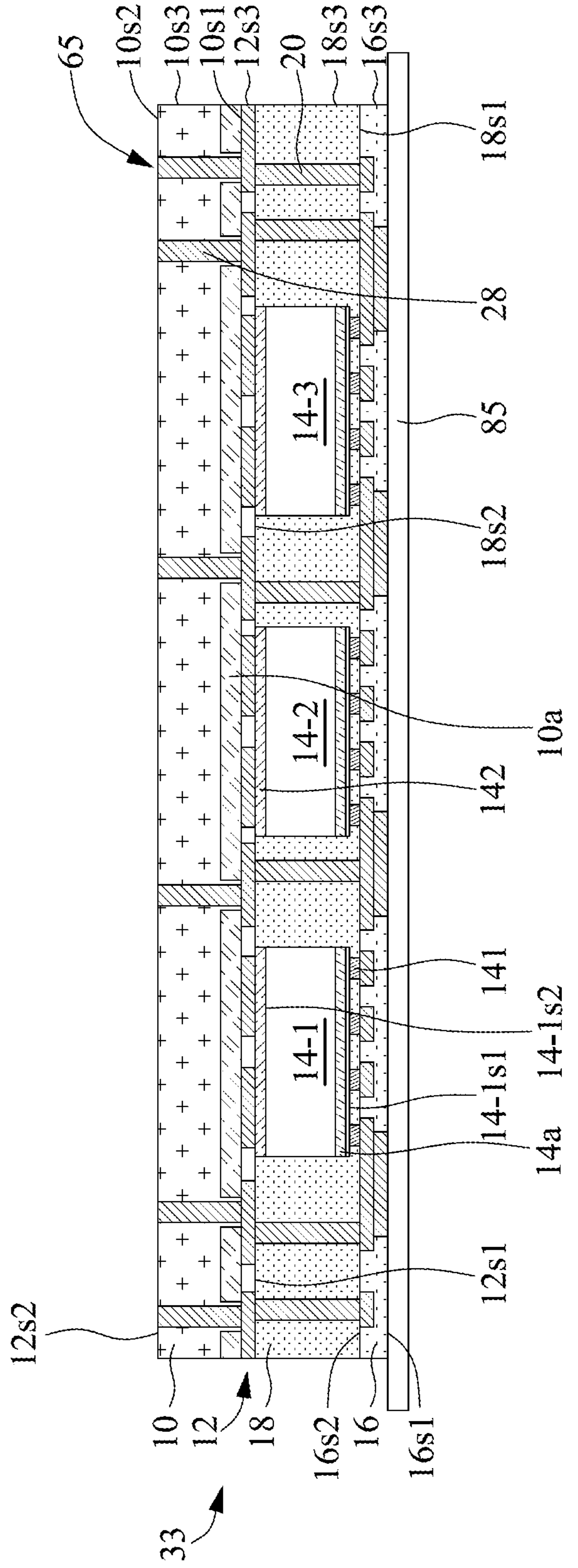
FIG. 15A illustrates one or more stages of an example of a method for manufacturing an electronic device according to some arrangements of the present disclosure.

FIG. 15A to FIG. 15E illustrates various stages of an example of a method for manufacturing an electronic device according to some arrangements of the present disclosure. FIG. 15A depicts a stage subsequent to that depicted in FIG. 13F.

Referring to FIG. 15A, a singulation technique may be performed on the substrate 10' to separate multiple electronic components 10. Next, the circuit layer 16 may be attached to a carrier 85. In this arrangement, a grounding structure 65 may be formed within the electronic component 10, the redistribution structure 12, and the encapsulant 18.

Figure 15B:
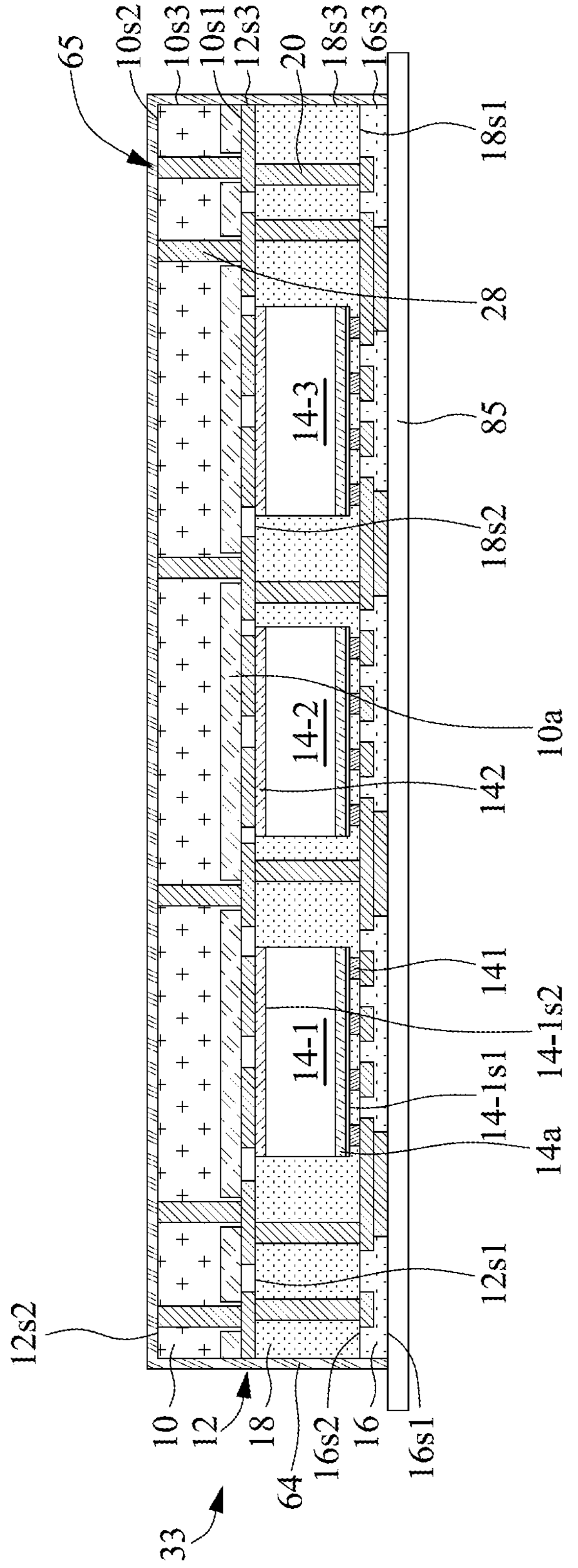
FIG. 15B illustrates one or more stages of an example of a method for manufacturing an electronic device according to some arrangements of the present disclosure.

Referring to FIG. 15B, a shielding layer 64 may be formed to cover the surface **10*s*2 of the electronic component 10. The shielding layer 64 may cover the surface 10*s*3 of the electronic component 10 and the surface 18*s*3 of the encapsulant 18. The shielding layer 64** may be formed by, for example, a sputter technique or other suitable techniques.

Figure 15C:
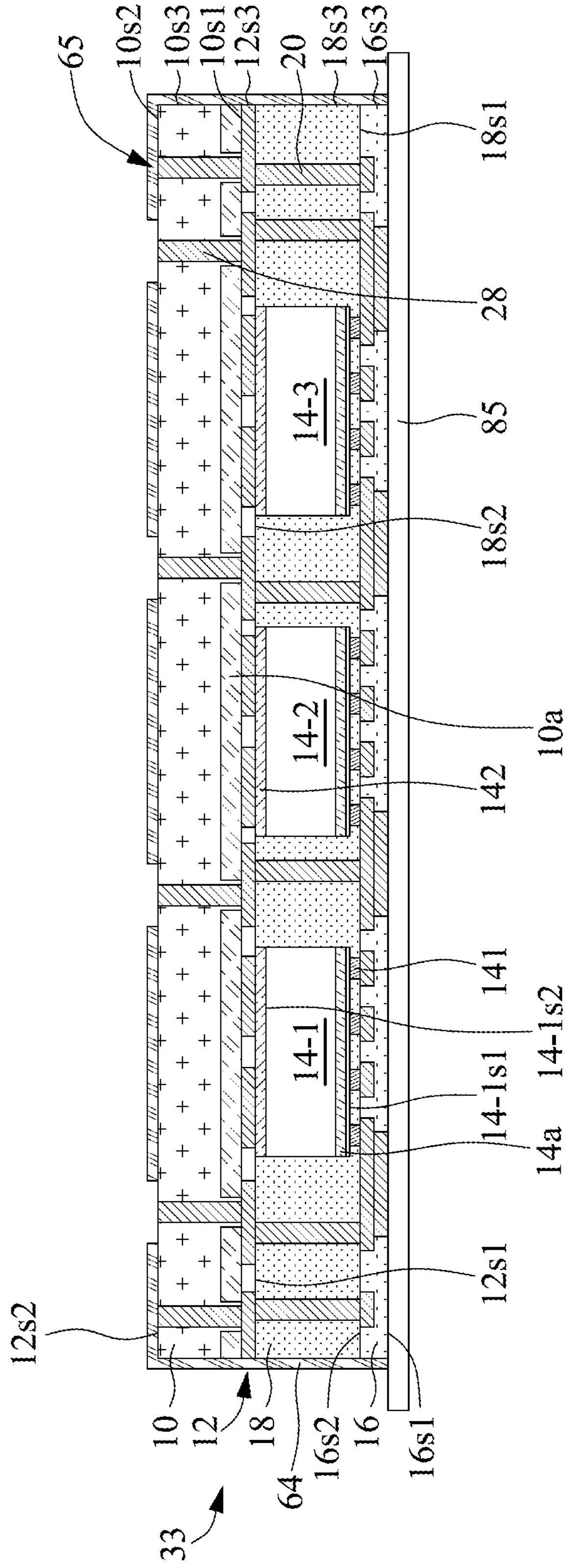
FIG. 15C illustrates one or more stages of an example of a method for manufacturing an electronic device according to some arrangements of the present disclosure.

Referring to FIG. 15C, the shielding layer 64 may be patterned to expose the through via 28 (e.g., the upper surface of the through via 28).

Figure 15D:
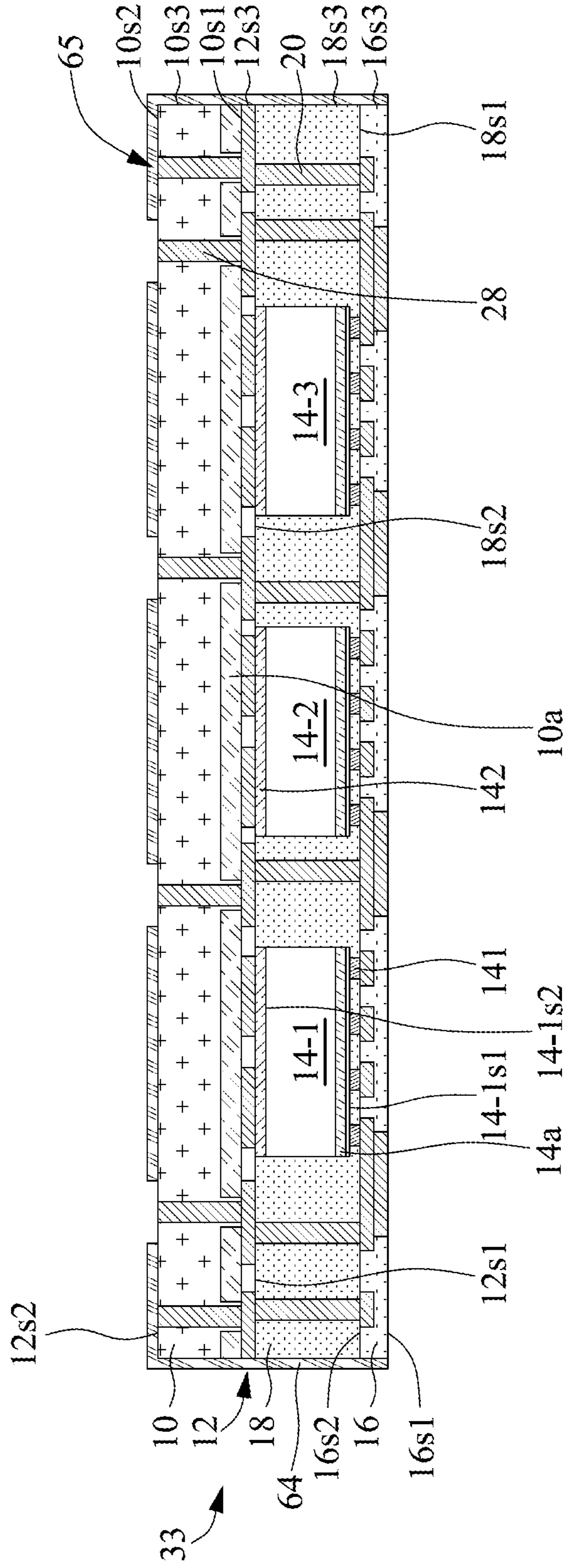
FIG. 15D illustrates one or more stages of an example of a method for manufacturing an electronic device according to some arrangements of the present disclosure.

Referring to FIG. 15D, the carrier 85 may be removed.

Figure 15E:
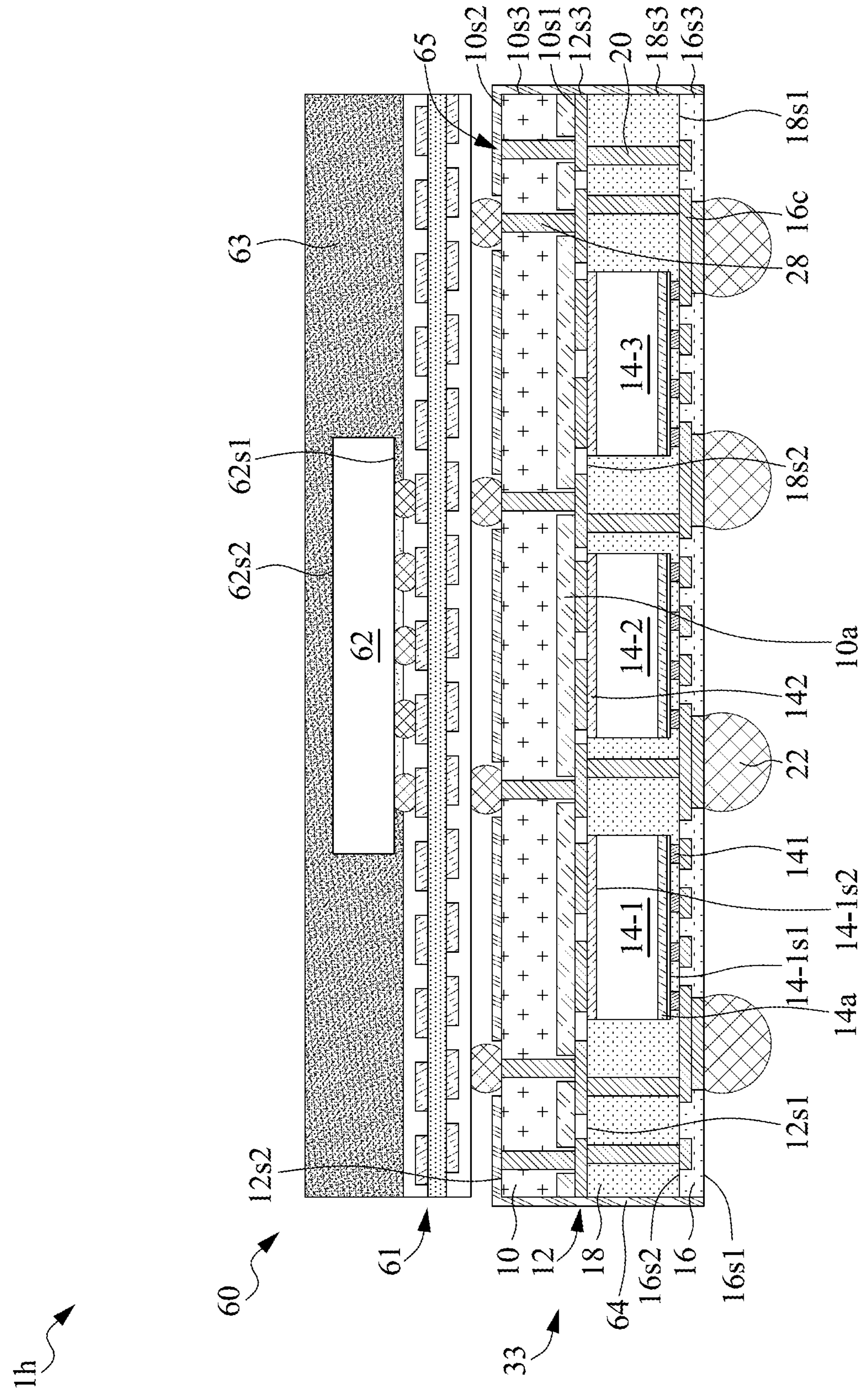
FIG. 15E illustrates one or more stages of an example of a method for manufacturing an electronic device according to some arrangements of the present disclosure.

Referring to FIG. 15E, an antenna package 60 may be mounted over the surface **10*s*2 of the electronic component 10. As a result, an electronic device, such as the electronic device 1*h* as shown in FIG. 8**, may be produced.

Figure 16A:
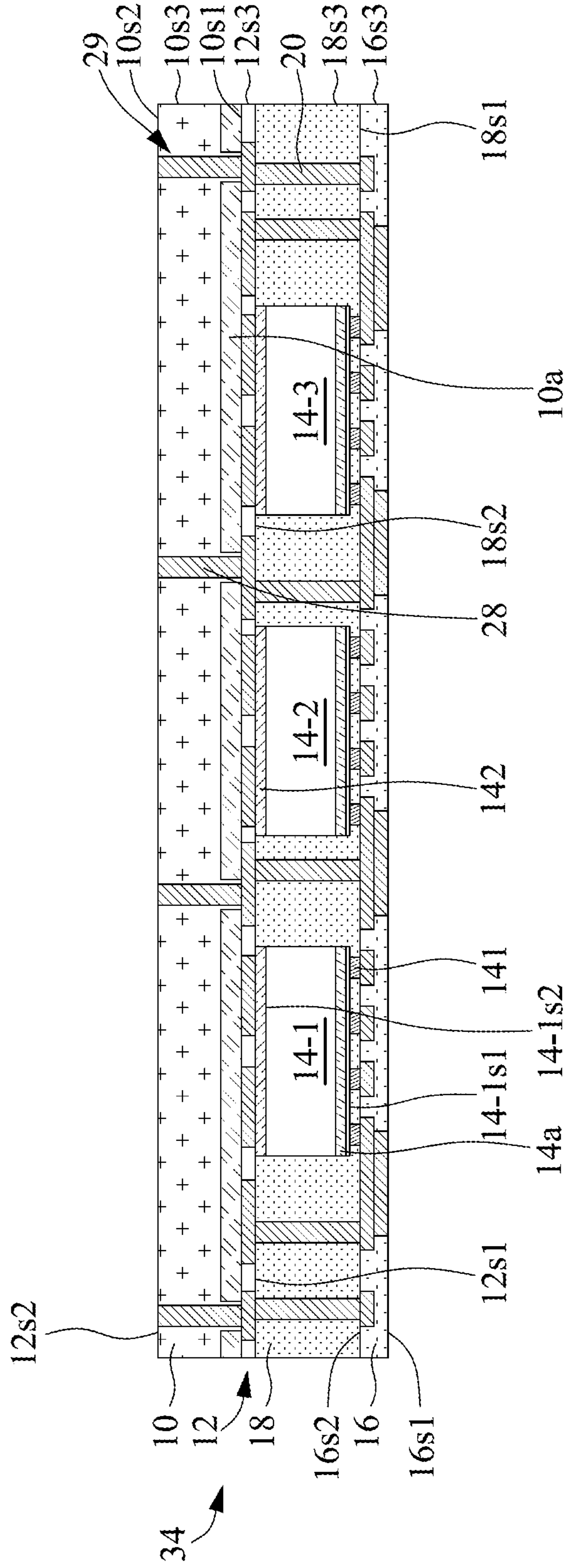
FIG. 16A illustrates one or more stages of an example of a method for manufacturing an electronic device according to some arrangements of the present disclosure.

FIG. 16A to FIG. 16H illustrates various stages of an example of a method for manufacturing an electronic device according to some arrangements of the present disclosure. FIG. 16A depicts a stage subsequent to that depicted in FIG. 13F.

Referring to FIG. 16A, a singulation technique may be performed on the substrate 10' to separate multiple electronic components 10.

Figure 16B:
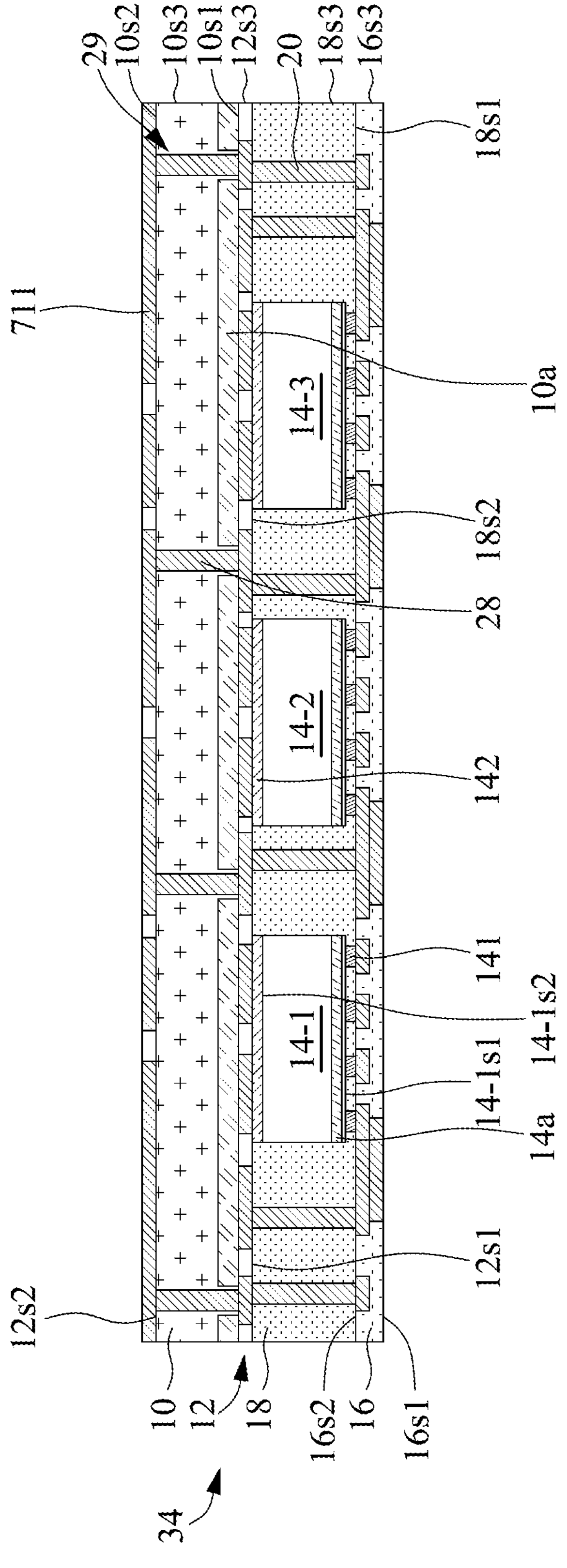
FIG. 16B illustrates one or more stages of an example of a method for manufacturing an electronic device according to some arrangements of the present disclosure.

Referring to FIG. 16B, a circuit pattern 711 may be formed over the surface **10*s*2 of the electronic component 10**.

Figure 16C:
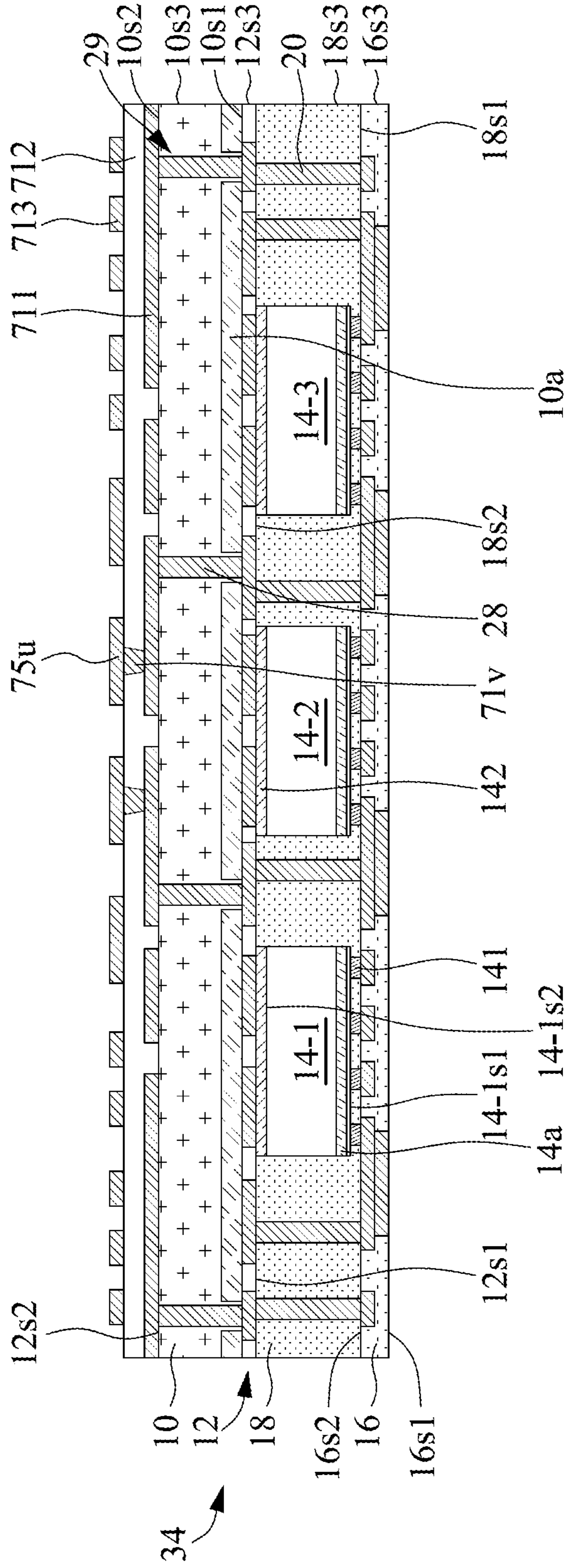
FIG. 16C illustrates one or more stages of an example of a method for manufacturing an electronic device according to some arrangements of the present disclosure.

Referring to FIG. 16C, a dielectric structure 712 may be formed to cover the circuit pattern 711. A circuit pattern 713 may be formed over the dielectric structure 712. A antenna 71 may be defined.

Figure 16D:
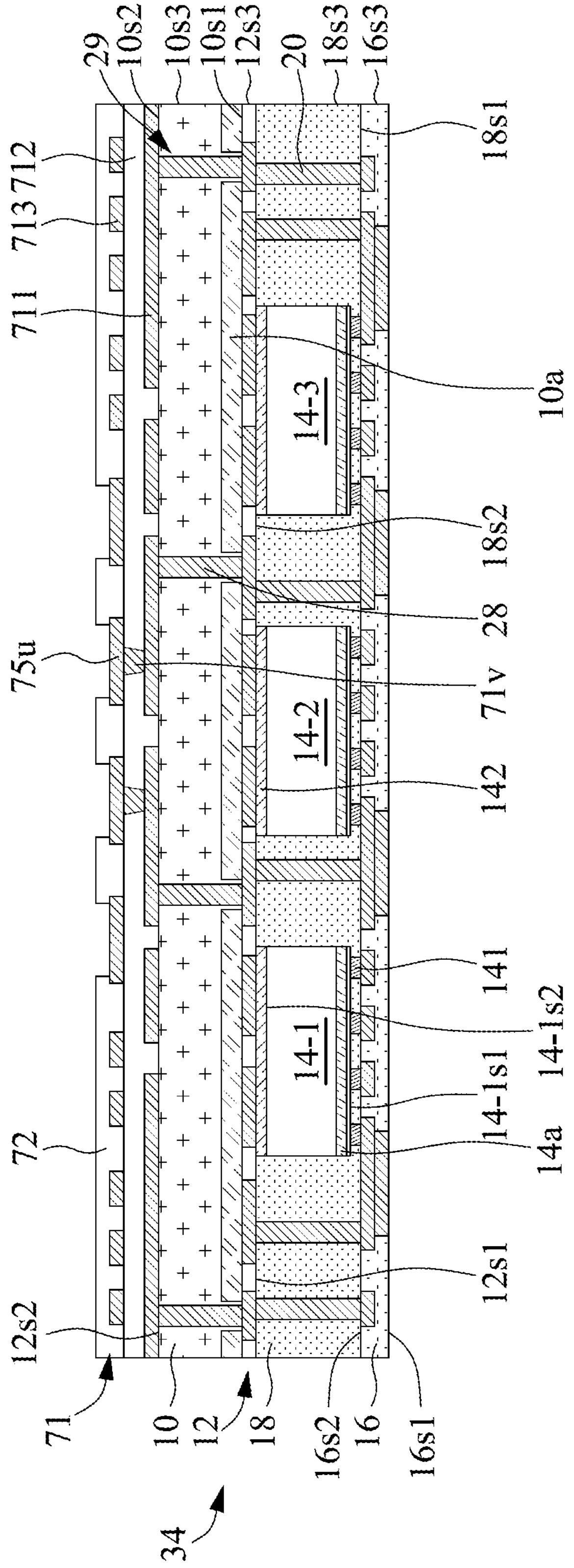
FIG. 16D illustrates one or more stages of an example of a method for manufacturing an electronic device according to some arrangements of the present disclosure.

Referring to FIG. 16D, a dielectric structure 72 may be formed to cover the dielectric structure 712.

Figure 16E:
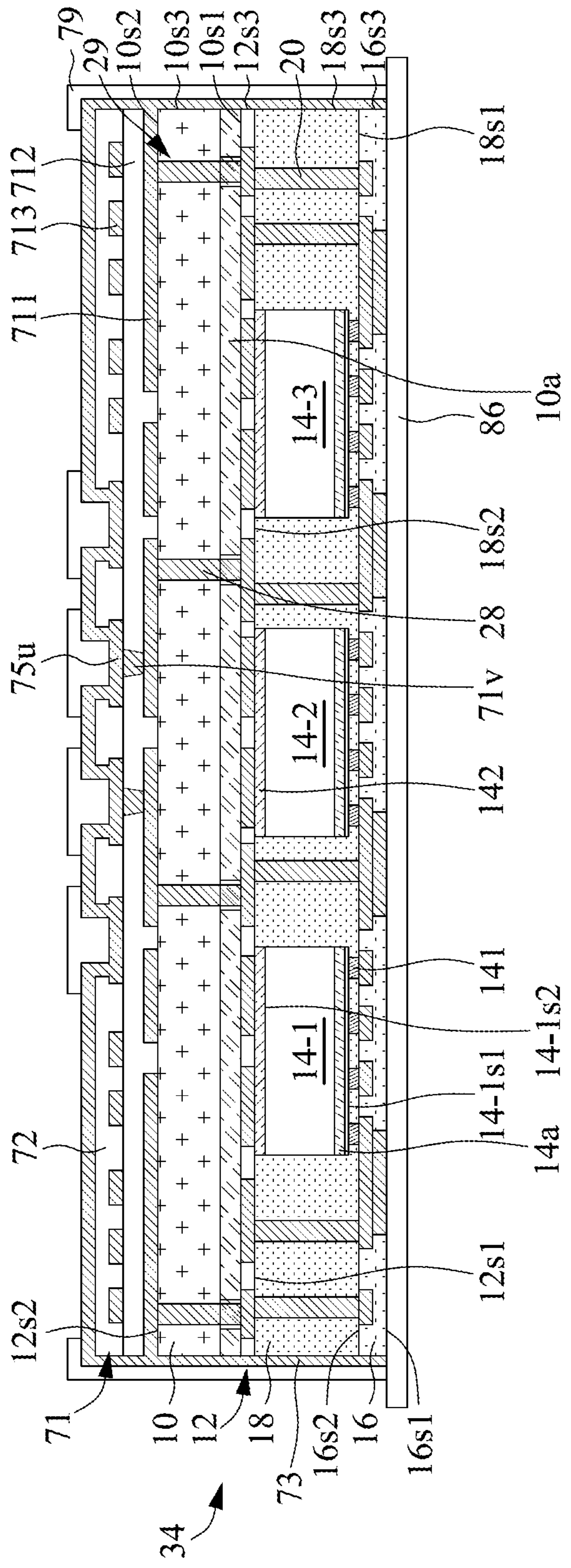
FIG. 16E illustrates one or more stages of an example of a method for manufacturing an electronic device according to some arrangements of the present disclosure.

Referring to FIG. 16E, the circuit layer 16 may be attached to a carrier 86. A shielding layer 73 may be formed to cover the dielectric structure 72 as well as the surface **10*s*3 of the electronic component 10 and the surface 18*s*3 of the encapsulant 18. A mask 79 may be formed on the shielding layer 73. The mask 79 may be patterned to expose a portion of the shielding layer 73**.

Figure 16F:
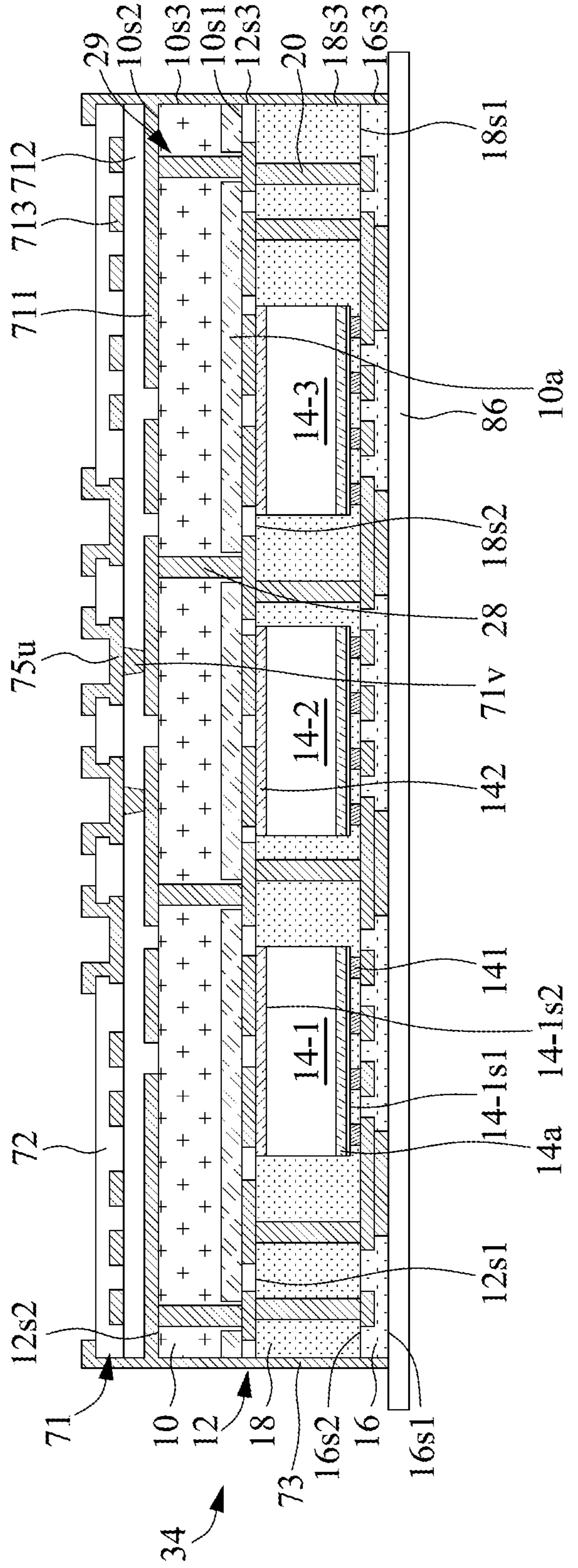
FIG. 16F illustrates one or more stages of an example of a method for manufacturing an electronic device according to some arrangements of the present disclosure.

Referring to FIG. 16F, the shielding layer 73 may be patterned. The portion of the shielding layer 73, exposed by the mask 79, may be removed. A portion of the dielectric structure 72 may be exposed. The mask 79 may be removed.

Figure 16G:
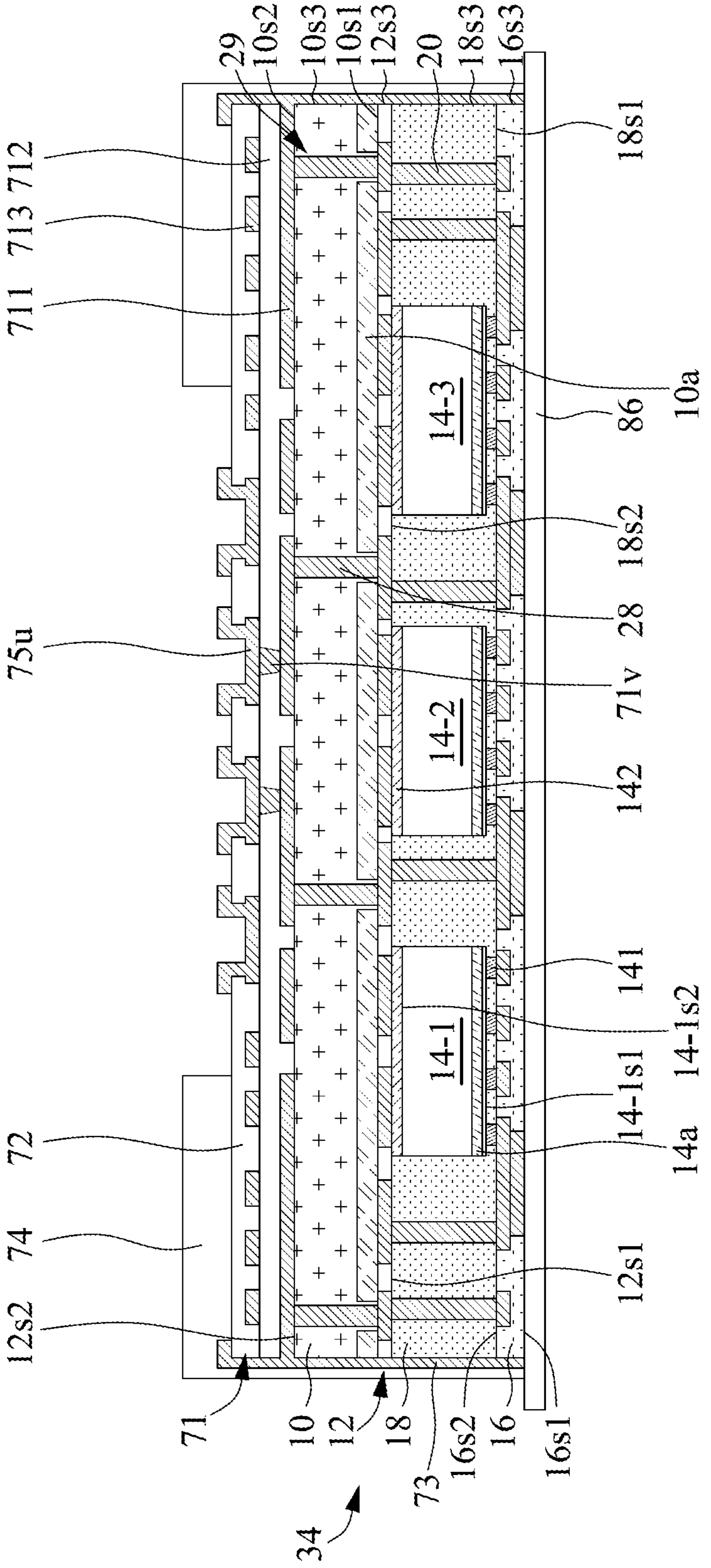
FIG. 16G illustrates one or more stages of an example of a method for manufacturing an electronic device according to some arrangements of the present disclosure.

Referring to FIG. 16G, a dielectric structure 74 may be formed to cover the shielding layer 73.

Figure 16H:
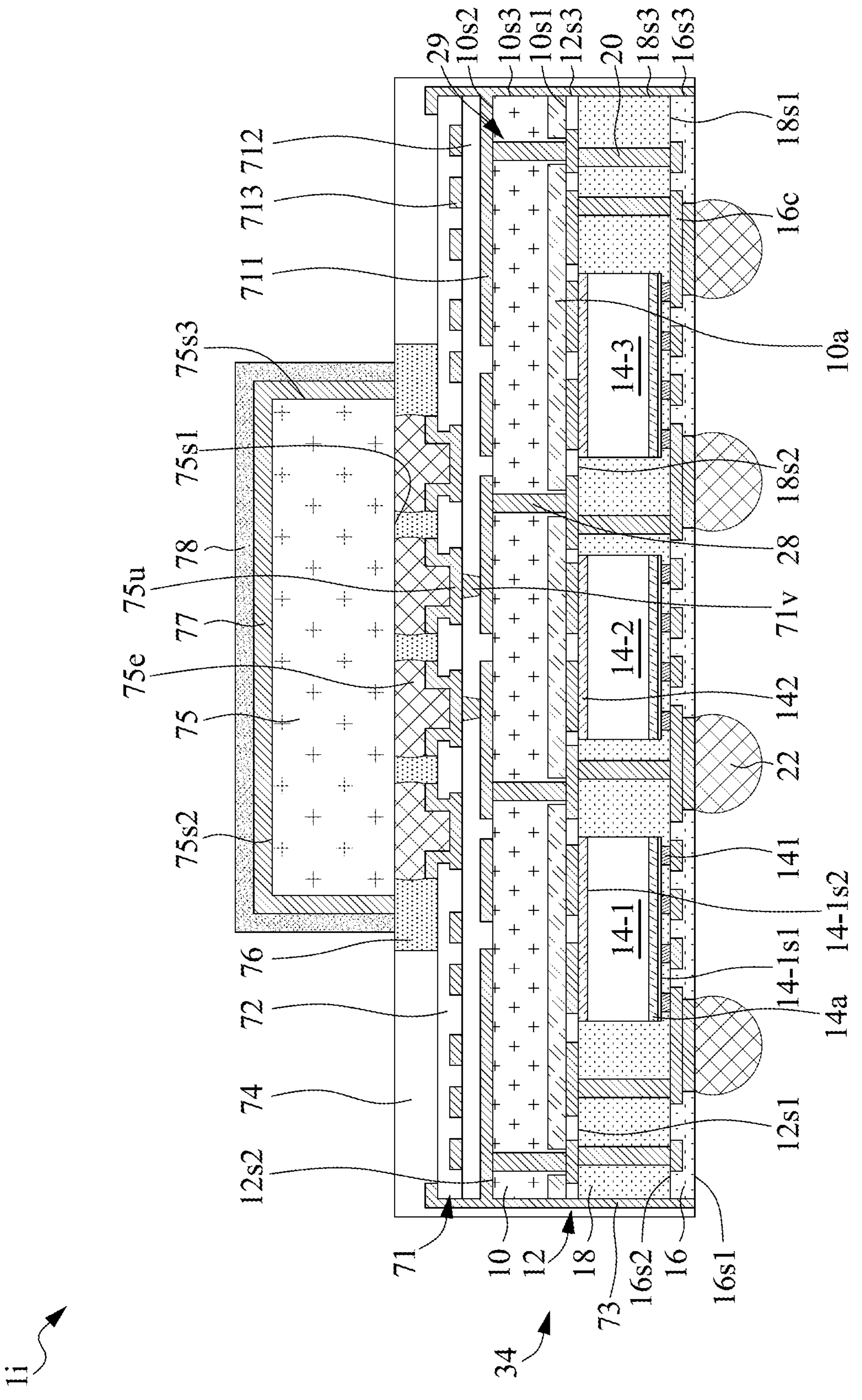
FIG. 16H illustrates one or more stages of an example of a method for manufacturing an electronic device according to some arrangements of the present disclosure.

Referring to FIG. 16H, an electronic component 75, a filler 76, a shielding layer 77, and a protection layer 78 may be formed over the antenna 71. As a result, an electronic device, such as the electronic device 1*i* as shown in FIG. 9, may be produced.

Spatial descriptions, such as "above," "below," "up," "left," "right," "down," "top," "bottom," "vertical," "horizontal," "side," "higher," "lower," "upper," "over," "under," and so forth, are indicated with respect to the orientation shown in the figures unless otherwise specified. It should be understood that the spatial descriptions used herein are for purposes of illustration only and that practical implementations of the structures described herein can be spatially arranged in any orientation or manner, provided that the merits of arrangements of this disclosure are not deviated from by such an arrangement.

As used herein, the term "vertical" is used to refer to upward and downward directions, whereas the term "horizontal" refers to directions transverse to the vertical directions.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, a first numerical value can be deemed to be "substantially" the same or equal to a second numerical value if the first numerical value is within a range of variation of less than or equal to ±10% of the second numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" perpendicular can refer to a range of angular variation relative to 90° that is less than or equal to ±10°, such as less than or equal to ±5°, less than or equal to ±4°, less than or equal to ±3°, less than or equal to ±2°, less than or equal to ±1, less than or equal to ±0.5°, less than or equal to ±0.1°, or less than or equal to ±0.05°.

Two surfaces can be deemed to be coplanar or substantially coplanar if a displacement between the two surfaces is no exceeding 5 μm, no exceeding 2 μm, no exceeding 1 μm, or no exceeding 0.5 μm. A surface can be deemed to be substantially flat if a displacement between the highest point and the lowest point of the surface is no exceeding 5 μm, no exceeding 2 μm, no exceeding 1 μm, or no exceeding 0.5 μm.

As used herein, the singular terms "a," "an," and "the" may include plural referents unless the context clearly dictates otherwise.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity exceeding approximately $10^4$ S/m, such as at least $10^5$ S/m or at least $10^6$ S/m. The electrical conductivity of a material can sometimes vary with temperature. Unless otherwise specified, the electrical conductivity of a material is measured at room temperature.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

While the present disclosure has been described and illustrated with reference to specific arrangements thereof, these descriptions and illustrations are not limiting. It should be understood by those skilled in the art that various changes may be made and equivalents may be substituted without departing from the true spirit and scope of the present disclosure as defined by the appended claims. The illustrations may not necessarily be drawn to scale. There may be distinctions between the artistic renditions in the present disclosure and the actual apparatus due to manufacturing processes and tolerances. There may be other arrangements of the present disclosure which are not specifically illustrated. The specification and drawings are to be regarded as illustrative rather than restrictive. Modifications may be made to adapt a particular situation, material, composition of matter, method, or process to the objective, spirit, and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. An electronic device, comprising:

a first electronic component;

a plurality of second electronic components disposed under the first electronic component; and a plurality of conductive elements electrically connecting the first electronic component to the plurality of second electronic components, wherein the plurality of conductive elements are free from vertically overlapping the plurality of second electronic components, and wherein the first electronic component comprises a through via configured to connect a component disposed over the first electronic component.

2. The electronic device of claim 1, further comprising:

an encapsulant encapsulating a lateral surface of the first electronic component.

3. The electronic device of claim 2, wherein the encapsulant encapsulates the plurality of second electronic components and the plurality of conductive elements.

4. The electronic device of claim 3, wherein at least one of the plurality of second electronic components has a passive surface facing the first electronic component and an active surface opposite to the passive surface, and the encapsulant covers the active surface.

5. The electronic device of claim 1, further comprising:

a shielding layer, wherein the component comprises an integrated circuit, and the shielding layer is disposed between the first electronic component and the integrated circuit to block electromagnetic interference.

6. The electronic device of claim 1, further comprising:

a conductive layer, wherein the component comprises an antenna, and the conductive layer is disposed between the first electronic component and the antenna to serve as a reference ground of the antenna.

7. The electronic device of claim 1, wherein the through via overlaps at least one of the plurality of second electronic components.

8. The electronic device of claim 1, further comprising:

a redistribution structure disposed under the plurality of second electronic components, wherein the plurality of conductive elements are electrically connected to the plurality of second electronic components by the redistribution structure.

9. The electronic device of claim 1, further comprising:

a heat dissipating element disposed over the first electronic component.

10. An electronic device, comprising:

a first electronic component;

a plurality of second electronic components disposed under the first electronic component;

a first circuit layer disposed under the plurality of second electronic components, wherein the first electronic component is electronically connected to the plurality of second electronic components by the first circuit layer; and a shielding layer covering the first electronic component and exposing a portion of an upper surface of the first electronic component.

11. The electronic device of claim 10, wherein the plurality of second electronic components do not vertically overlap each other.

12. The electronic device of claim 10, further comprising:

an encapsulant encapsulating the plurality of second electronic components; and a conductive element penetrating the encapsulant and electrically connecting the first circuit layer and the first electronic component.

13. The electronic device of claim 12, wherein an upper surface of the encapsulant is substantially aligned with a passive surface of the first electronic component.

14. The electronic device of claim 10, wherein the first electronic component comprises a first conductive via electrically connected to the shielding layer and a second conducive via exposed by the upper surface of the first electronic component.

15. The electronic device of claim 14, wherein the shielding layer covers a lateral surface of the first electronic component.

* * * * *